(12) United States Patent  
Minami et al.

(10) Patent No.: US 7,064,090 B2
(45) Date of Patent: Jun. 20, 2006

(54) METHOD OF MANUFACTURING A SEMICONDUCTOR INTEGRATED CIRCUIT DEVICE

(75) Inventors: Shinichi Minami, Kodaira (JP); Yoshiaki Kamigaki, Tokorozawa (JP); Hideki Yasuoka, Musashino (JP); Fukuo Owada, Ome (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/942,860

(22) Filed: Sep. 17, 2004

(65) Prior Publication Data

US 2005/0032298 A1    Feb. 10, 2005

Related U.S. Application Data

(62) Division of application No. 09/768,471, filed on Jan. 25, 2001, now Pat. No. 6,803,644.

(30) Foreign Application Priority Data

Jan. 28, 2000    (JP) .............................. 2000-020920

(51) Int. Cl.
   *H01L 21/00*    (2006.01)
(52) U.S. Cl. ........................ 438/800; 438/983; 257/10
(58) Field of Classification Search ............... 438/800, 438/983; 257/10, 11, 490, 491
   See application file for complete search history.

(56) References Cited

U.S. PATENT DOCUMENTS

| | | | |
|---|---|---|---|
| 3,881,179 A | 4/1975 | Howard et al. | |
| 3,886,579 A | 5/1975 | Ohuchi et al. | |
| 4,258,311 A * | 3/1981 | Tokuda et al. | ............... 323/313 |
| 4,441,114 A | 4/1984 | Muggli | |
| 4,590,664 A | 5/1986 | Prentice et al. | |
| 4,646,114 A | 2/1987 | Vinn et al. | |
| 4,748,533 A | 5/1988 | Hertrich et al. | |
| 5,027,165 A | 6/1991 | Doluca | |
| 5,502,399 A | 3/1996 | Imai | |
| 5,691,554 A | 11/1997 | Matthews | |
| 5,756,387 A | 5/1998 | Villa et al. | |
| 5,850,087 A * | 12/1998 | Van Zutphen | ............... 257/10 |
| 5,929,503 A | 7/1999 | Beasom | |
| 6,114,872 A | 9/2000 | Takahashi | |

FOREIGN PATENT DOCUMENTS

| | | |
|---|---|---|
| GB | 2130792 A | 6/1984 |
| JP | 63-066974 | 3/1988 |
| JP | 64-059949 | 3/1989 |
| JP | 3-108376 | 5/1991 |

* cited by examiner

*Primary Examiner*—Phuc T. Dang
(74) *Attorney, Agent, or Firm*—Antonelli, Terry, Stout and Kraus, LLP.

(57) ABSTRACT

A manufacturing technique for a zener diode which includes forming a first semiconductor region in a region such as a well region at a primary face of a semiconductor substrate and then forming a second semiconductor region of opposite conductivity type thereover. The second semiconductor region covers an area greater than the underlying first semiconductor region. The method further calls for forming an insulating film on the primary face of the substrate followed by the forming connection holes in the insulating film to expose an upper part of the second semiconductor region located outside the area covered by the junction affected between the first and second semiconductor regions. This is followed by the formation of a wire at the upper part of the insulating film in which an electrical connection is affected between the wire and the second semiconductor region through the plural connection holes which are distributively arranged.

24 Claims, 24 Drawing Sheets

FIG.5
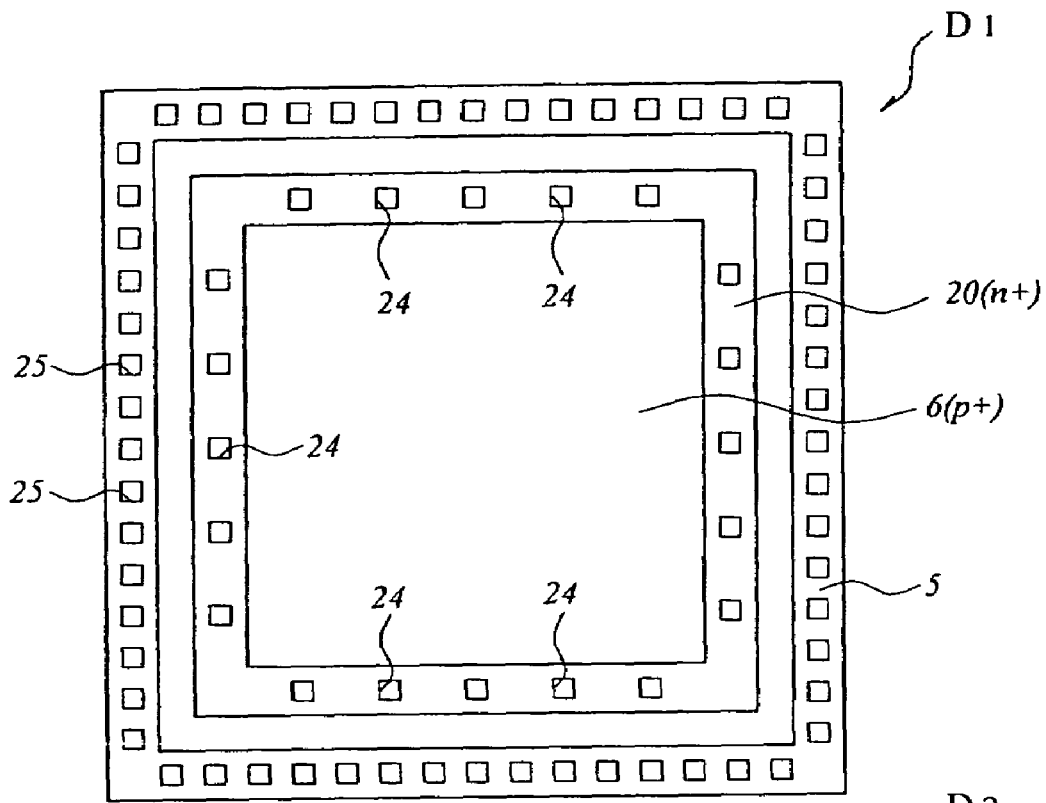
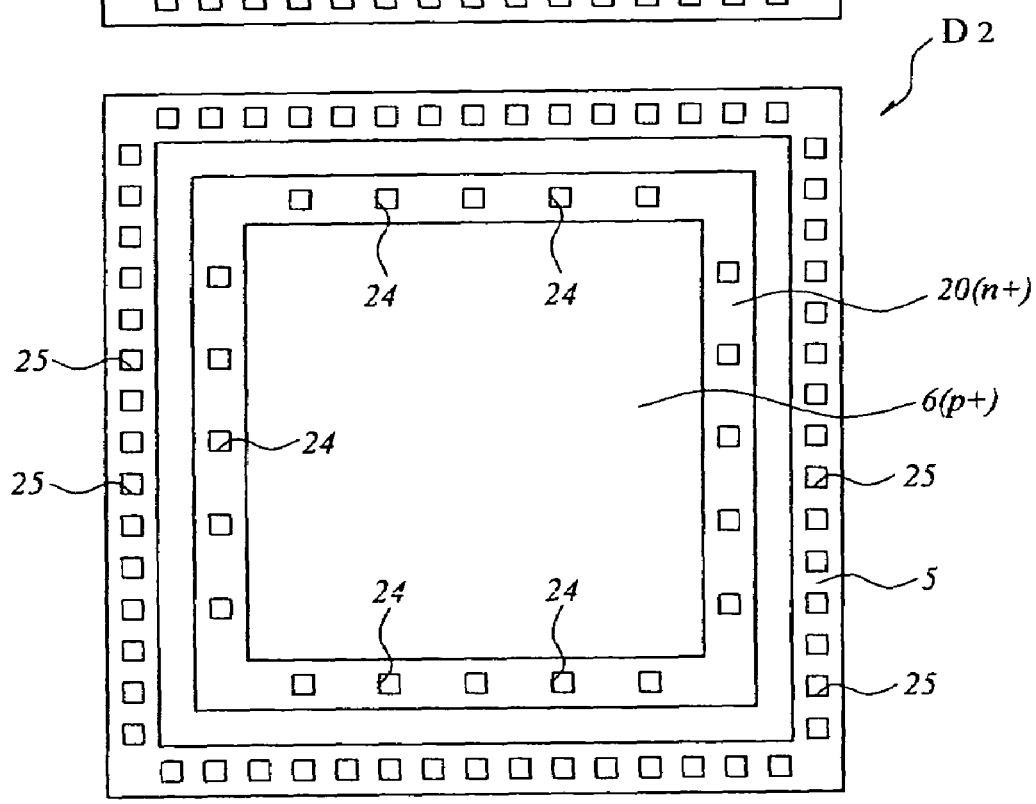

(a) a total of 18 holes (b) a total of 9 holes used in the present invention

METHOD OF MANUFACTURING A SEMICONDUCTOR INTEGRATED CIRCUIT DEVICE

This application is a divisional of U.S. application Ser. No. 09/768,471, filed Jan. 25, 2001, now U.S. Pat. No. 6,803,644, the entire disclosure of which is incorporated herein by reference.

TECHNICAL FIELD OF THE INVENTION

The present invention relates to a semiconductor integrated circuit device and a method of manufacturing the same. In particular, the present invention relates to a technique that is effective to apply a clamp element of an internal boosting circuit to a semiconductor integrated circuit device comprising a zener diode.

BACKGROUND OF THE INVENTION

An EEPROM (Electrically Erasable and Programmable ROM) that is a type of memory LSI comprises a constant voltage generating circuit for applying a voltage (Vpp) Higher than a power supply voltage (Vcc) to a gate electrode when rewriting (writing and erasing) data. A zener diode as a clamp element for voltage stabilization is connected to the boosting circuit in the constant voltage generating circuit, whereby the rewrite voltage (Vpp) is constantly supplied to the EEPROM. A publicly known zener diode of such type is disclosed in Japanese Patent Laid-open No. 64-59949, dated Mar. 7, 1989, for example.

The zener diode described in the above-mentioned Laid-open No. 64-59949 is composed of: an $n^+$ type semiconductor region formed in a p type well of a semiconductor substrate; and a $p^+$ type semiconductor region formed in a p type well at a lower part of this $n^+$ type semiconductor region. An area surrounding a planar pattern on the $p^+$ type semiconductor region is smaller than that of the $n^+$ type semiconductor region, and the $p^+$ type semiconductor region is located so as to be substantially centered to that of the $n^+$ type semiconductor region. In this manner, the $p^+$ type semiconductor region and $n^+$ type semiconductor region have such a structure as is closed in the semiconductor substrate, so that the structure can prevent an occurrence of a problem with a leakage current due to an interface level of an interface between the semiconductor substrate and an insulation film (silicon oxide film) on an upper part thereof.

To the $p^+$ type well in which the above $p^+$ type semiconductor region is formed and the $n^+$ type semiconductor region is formed thereon, a wire is connected through a connection hole provided in an insulation film that covers upper parts of both. To the $n^+$ type semiconductor region, a wire is connected through the center thereof, i.e., a connection hole formed at the insulation film located in the upper part of the $p^+$ type semiconductor region.

SUMMARY OF THE INVENTION

As an EPROM becomes fine and highly integrated, a junction depth between source and drain of a MISFET (Metal Insulator Semiconductor Field Effect Transistor) that constitutes a memory cell or a peripheral circuit is gradually made more shallow, and accordingly, a junction depth between the $n^+$ type semiconductor region and $p^+$ type semiconductor region that constitutes a zener diode in the constant voltage generating circuit is gradually made more shallow as well. In addition, since the connection hole for connecting the $n^+$ type semiconductor region or $p^+$ type semiconductor region to a wire becomes small in diameter, it is difficult to form the connection hole by dry etching.

Therefore, in the zener diode as described in the above-mentioned Laid-open No. 64-59949, when a connection hole is formed for connecting the $n^+$ type semiconductor region and a wire to each other, a difference in diameter between an element and a connection hole formed in a highly dense memory region or the like causes a substrate around the greater connecting hole in diameter in a zener diode forming region to be excessively shaved off. And, since thickness (the junction depth) of the $n^+$ type semiconductor region of a pn junction at a bottom of the connection hole ($p^+$ type semiconductor region/$n^+$ type semiconductor region) becomes extremely thin, an increase of a leakage current caused by a tunnel current or the like becomes obvious.

As a result, there occurs a problem that the leakage current at a fall (breakdown) start voltage of a zener diode exceeds 10 μA, for example, and that a desired rewrite voltage cannot be obtained because a clamp voltage is lowered.

An object of the present invention is to provide a technique capable of reducing a leakage current of a zener diode.

Another object of the present invention is to provide a technique capable of suppressing a substrate shaving caused when a connection hole is formed for connecting a substrate and a wire to each other.

The foregoing and the other objects and new characteristics of the present invention will be apparent from a description of the present specification and the accompanying drawings thereof.

Example featured aspects of the present invention, disclosed in the present application, will be briefly described by the following:

(1) A semiconductor integrated circuit device of the present invention includes a semiconductor substrate of a first conductivity type; a zener diode comprised of a first semiconductor region of a second conductivity type formed in a primary face (i.e., principal surface) of the semiconductor substrate, and a second semiconductor region of the first conductivity type formed in the semiconductor substrate at a bottom portion of said first semiconductor region and being smaller in area, defined by a planar pattern thereof, than said first semiconductor region, wherein a plurality of first connection holes for electrically connecting said first semiconductor region and a wire to each other are arranged in a region located outside a junction formed between said first semiconductor region and said second semiconductor region.

(2) A semiconductor integrated circuit device of the present invention includes a semiconductor substrate of a first conductivity type; a zener diode comprised of a first semiconductor region of a second conductivity type formed in a primary face (i.e., principal surface) of the semiconductor substrate, and a second semiconductor region of a first conductivity type formed in the semiconductor substrate at a bottom portion of said first semiconductor region and being smaller in area, defined by a planar pattern thereof, than said first semiconductor region, wherein a plurality of first connection holes for connecting said first semiconductor region and a wire to each other are arranged in a region located outside a junction formed between said first semiconductor region and said second semiconductor region, and wherein each of said plurality of first connection holes is spaced from each other so that a pitch between the adjacent first connection holes is greater than a maximum pitch between connection holes of the circuit.

(3) A semiconductor integrated circuit device of the present invention according to the above-mentioned (1) or (2), wherein each of said plurality of first connection holes is spaced from each other so that a pitch between the adjacent first connection holes is greater than a minimum pitch between connection holes of the circuit.

(4) A method of manufacturing a semiconductor integrated circuit device of the present invention comprises:

(a) forming a semiconductor region of a first conductivity type in a first region on a primary face (i.e., principal surface) of a semiconductor substrate of a first conductivity type, and then forming, on said semiconductor substrate located in a top portion of the semiconductor region of said first conductivity type, a semiconductor region of a second conductivity type that has a greater area of a planar pattern than the semiconductor region of said first conductivity type, and thereby forming a zener diode comprised of the semiconductor region of said first conductivity type and the semiconductor region of said second conductivity type;

(b) forming an insulation film on the primary face of said semiconductor substrate, and then forming a plurality of connection holes in said insulation film at an upper part of a region located outside a junction formed between the semiconductor regions of said first and second conductivity types; and (c) forming a wire at the upper part of said insulation film, and thereby electrically connecting said wire and the semiconductor region of said second conductivity type through said plurality of connection holes.

BRIEF DESCRIPTIONS OF THE DRAWINGS

FIG. 5 is a schematic plane view on the condition that wires not shown are connected to the zener diode of FIG.3.

Figure 25:
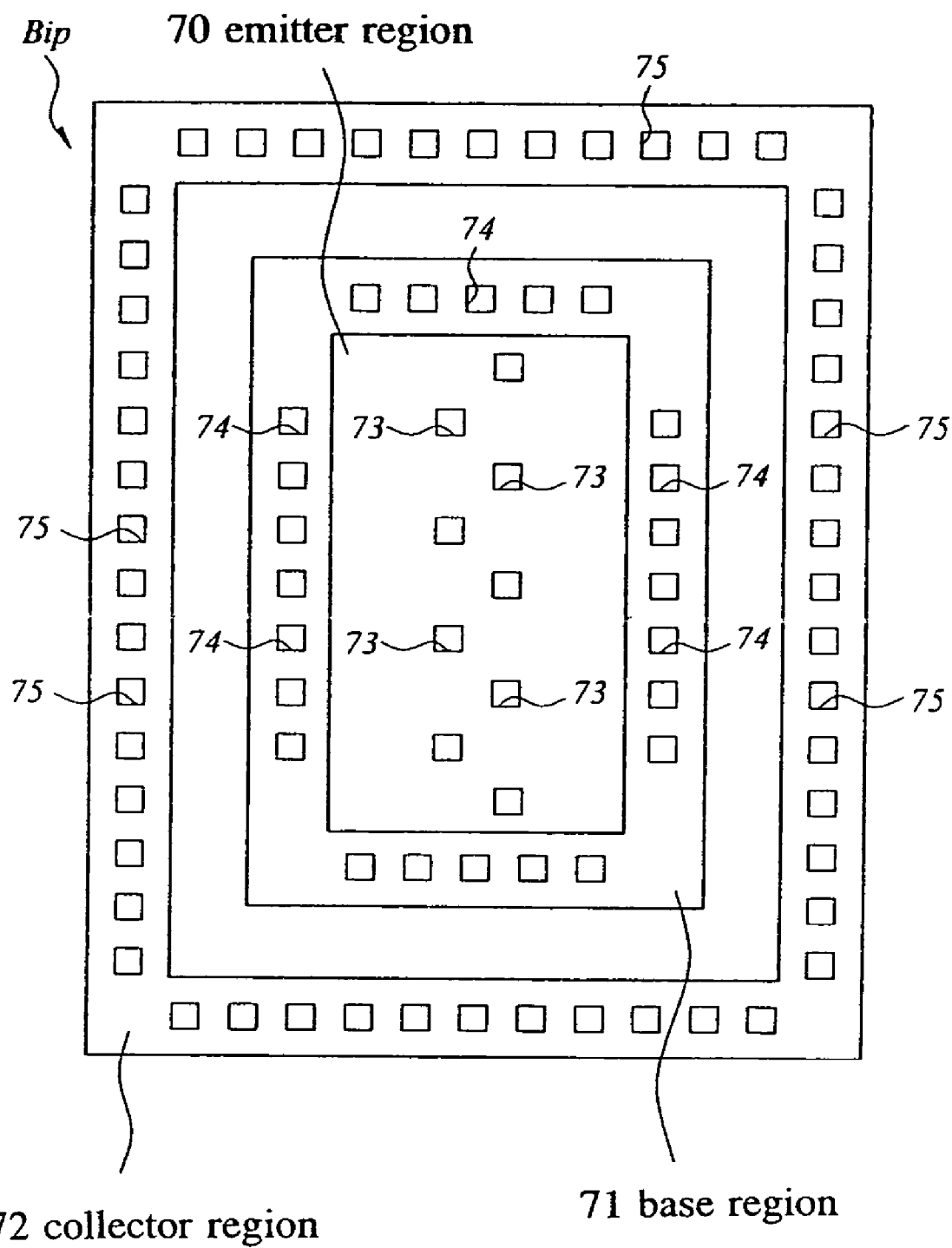
Figure 26:
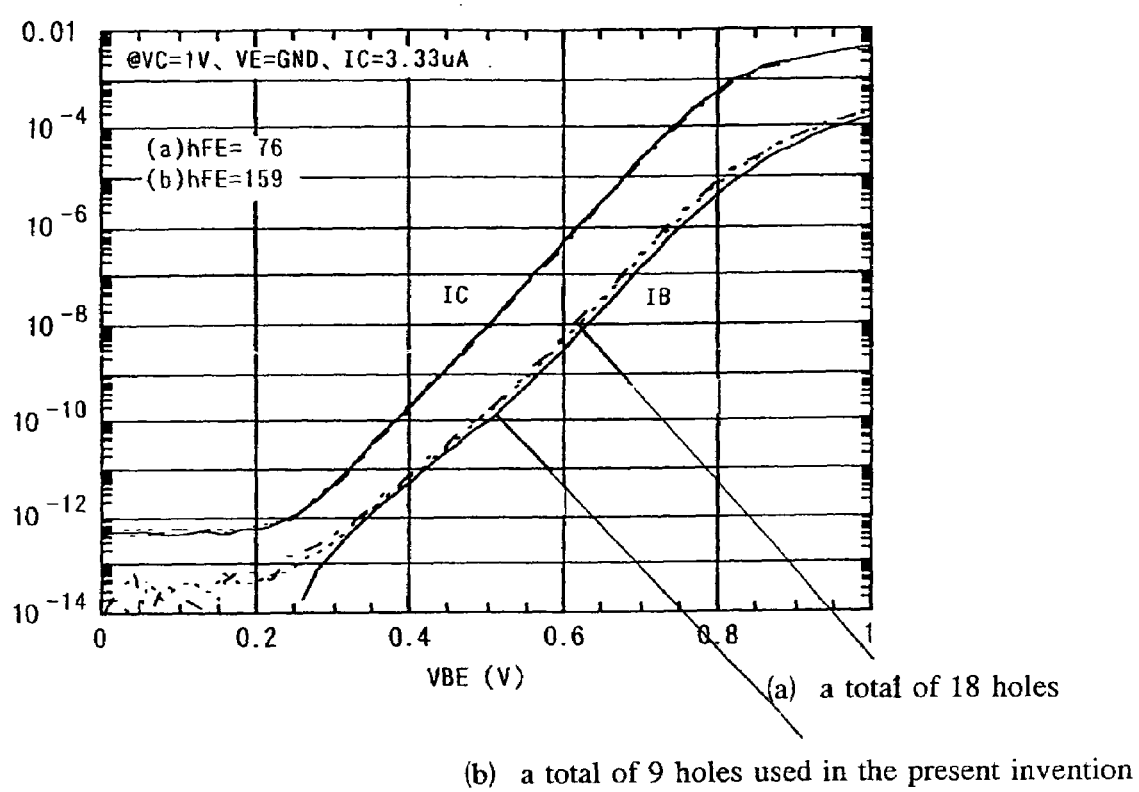

FIG. 25 is a plane view showing a bipolar transistor formed in a system LSI according to another embodiment of the present invent ion and showing a layout of connection holes formed thereon; and FIG. 26 is a graph showing a relationship between a pitch of a connection hole formed at an upper part of an emitter region and a direct current amplification rate hFE (collector current $I_C$/base current $I_B$).

DESCRIPTIONS OF THE PREFERRED EMBODIMENTS

Hereinafter, embodiments of the present invention will be described on the basis of the accompanying drawings. In all figures for describing the embodiments, elements having the same functions are designated by the same reference numerals, and a duplicated description thereof will be omitted.

First Embodiment

Figure 1:
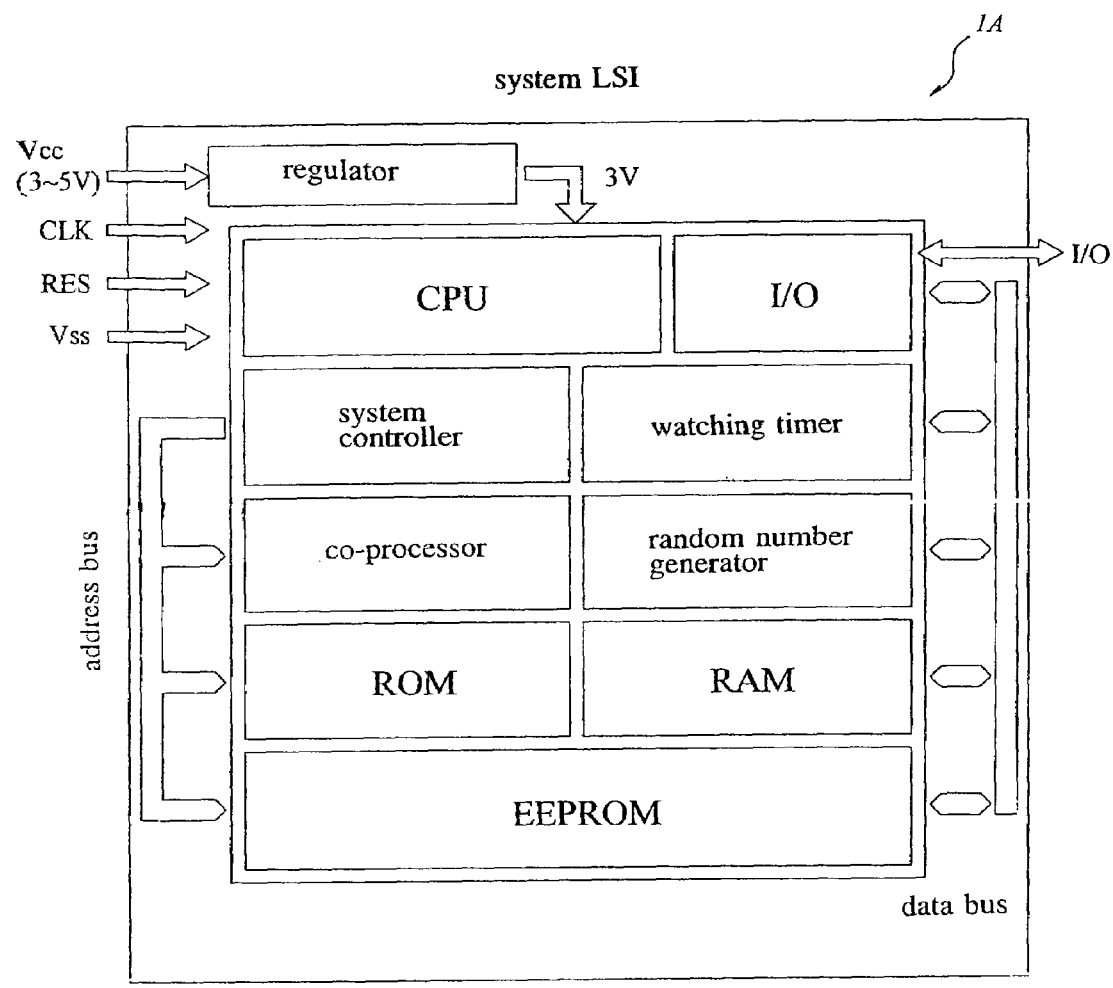
FIG. 1 is a block diagram showing a semiconductor chip on which a system LEI according to one embodiment of the present invention is formed.

FIG. 1 is a block diagram showing a semiconductor chip on which a system LSI according to the present embodiment is formed. The system LSI formed on this semiconductor chip 1A is incorporated in an IC card, for example, and is used. This system LSI is composed of a central processing unit (CPU), an input/output circuit (I/O), a system controller, a watchdog timer, a random number generator, a ROM (Read Only Memory), a RAM (Random Access Memory), and a EEPROM and the like.

Figure 2:
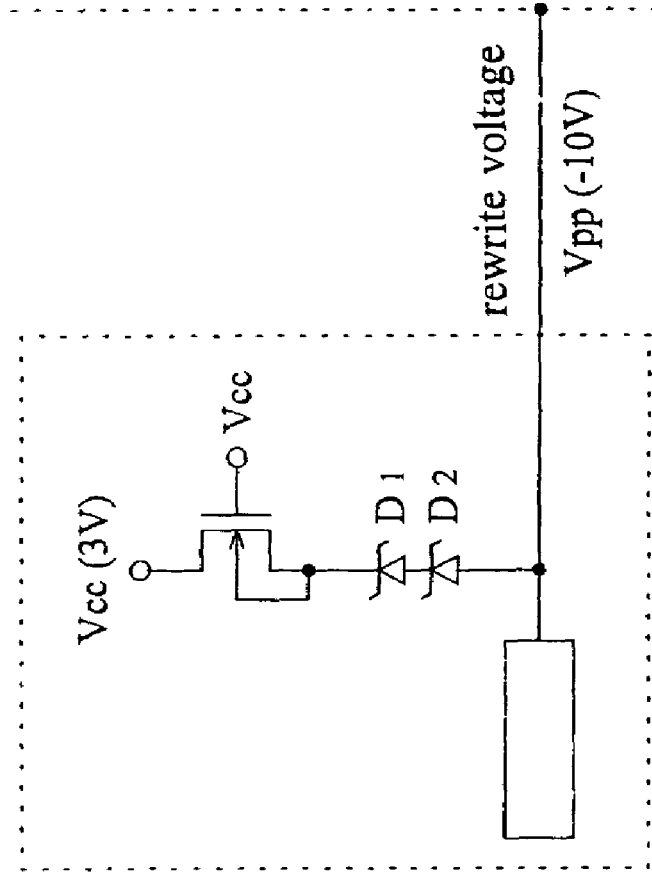
FIG. 2 is a circuit diagram showing a constant voltage generating circuit incorporated in a system LEI according to one embodiment of the present invention.

A EEPROM that constitutes a part of the above system LSI is used as data memory of an IC card, for example, so that a high voltage (Vpp) for rewriting (writing and erasing) is supplied through a constant voltage generating circuit that is incorporated in the semiconductor chip 1A as shown in FIG. 2. The constant voltage generating circuit boosts an external power supply voltage (Vcc) of 3 V to 5 V, for example, to generate a rewrite voltage (Vpp) of about −13 V. In addition, a two-step (i.e., two-stage) zener diode ($D_1$, $D_2$) that is a clamp element for voltage stabilization is connected to the boosting circuit in a constant voltage generating circuit, and the rewrite voltage (Vpp) is constantly supplied to the EEPROM by means of these zener diodes($D_1$, $D_2$).

Figure 3:
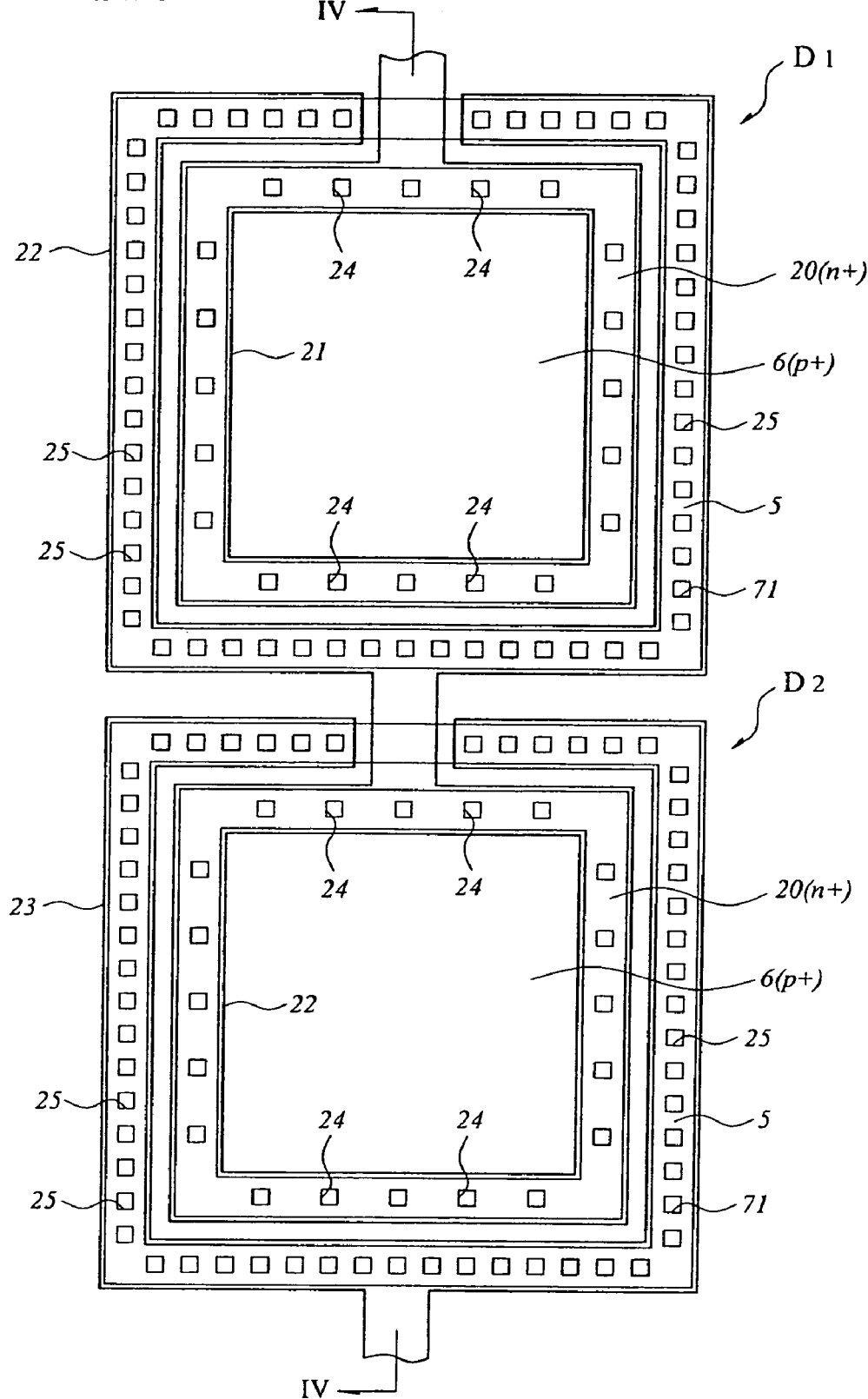
FIG. 3 is a plane view showing a zener diode formed in a system LEI according to one embodiment of the present invention.
Figure 4:
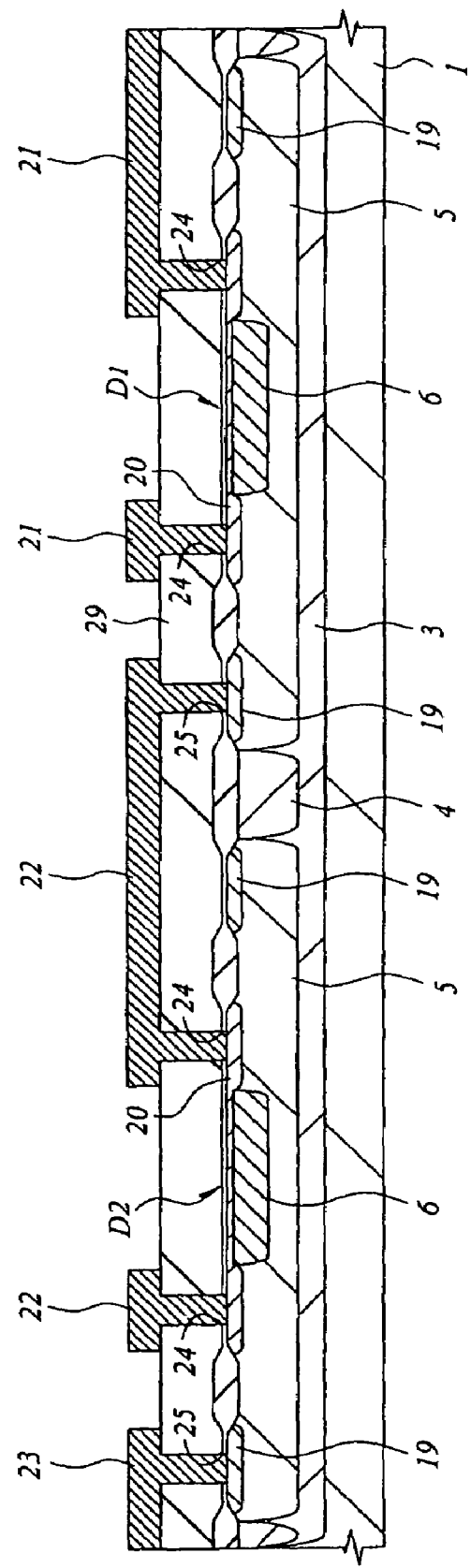
FIG. 4 is a cross section showing a semiconductor substrate taken along line IV—IV shown in FIG. 3.

FIG. 3 is a plane view showing the above zener diode (D1, D2), FIG. 4 is a cross section showing a semiconductor substrate taken along line IV—IV shown in FIG. 3, and FIG. 5 is a schematic plane view on the condition that wires not shown are connected to the zener diode ($D_1$, $D_2$) shown in FIG. 3.

Each of the zener diodes ($D_1$, $D_2$) is composed of: an $n^+$ type semiconductor region 20 formed in respective p type wells 5 of a semiconductor substrate (hereinafter, referred to as a substrate) 1; and a $p^+$ type semiconductor region 6 formed in respective p type wells 5 at a lower part of (i.e., beneath) this $n^+$ type semiconductor region 20. The $p^+$ type semiconductor region 6 is smaller than the $n^+$ type semiconductor region 20 in area of a planar pattern and is located so as to be substantially centered to that of the $n^+$ semiconductor region 20.

Planar dimensions of the $n^+$ type semiconductor region 20 is, for example, a degree of 25 to 27 microns long and 25 to 27 microns broad, and planar dimensions of the $p^+$ type semiconductor 6 is, for example, a degree of 20 microns long and 20 microns broad. In addition, the junction depth of the $n^+$ type semiconductor region 20 is, for example, as shallow as 0.12 to 0.18 micrometer, at its center, that is, at a region in which the $p^+$ type semiconductor region 6 is formed, and is deeper at its periphery, that is, at a region in which the $p^+$ type semiconductor region 6 is not formed.

Wires 21 to 23 are provided at the upper part of the above two zener diodes ($D_1$, $D_2$). Of these wires 21 to 23, the wires 21 are electrically connected to the $n^+$ type semiconductor region 20 of one zener diode ($D_1$) through a plurality of connection holes 24 formed in a silicon oxide film 29 that covers upper parts of the zener diodes ($D_1$, $D_2$). One of the wires 22 is electrically connected to the $n^+$ type semiconductor region 20 of the other zener diode ($D_2$) through one of a plurality of connection holes 24 formed in the silicon oxide film 29. These connection holes 24 are arranged with substantially equal intervals at the periphery of the $n^+$ type semiconductor region 20, that is, along a region in which the $n^+$ type semiconductor region 20 and the $p^+$ type semiconductor region 6 do not form a junction.

In addition, the other part of the wires 22 and a wire 23 are electrically connected to the p type well 5 and $p^+$ type semiconductor region 6 via a plurality of connection holes 25 formed in the silicon oxide film 29, respectively. One and the other of the zener diodes ($D_1$, $D_2$) are connected to each other in series via the other of wires 22.

Each of a plurality of connection holes 24 for connecting the $n^+$ type semiconductor region 20 and the wires 21 and 22 in a first layer to each other is spaced so that a pitch between the adjacent connection holes 24 is greater than a minimum pitch between connection holes of the circuit. For example, in the case where a minimum pitch between the connection holes for connecting a circuit element that constitutes this system LSI, for example, and a wire in the first layer to each other is 0.95 micron, a pitch between the connection holes 24 is about 3.8 microns.

Figure 6:
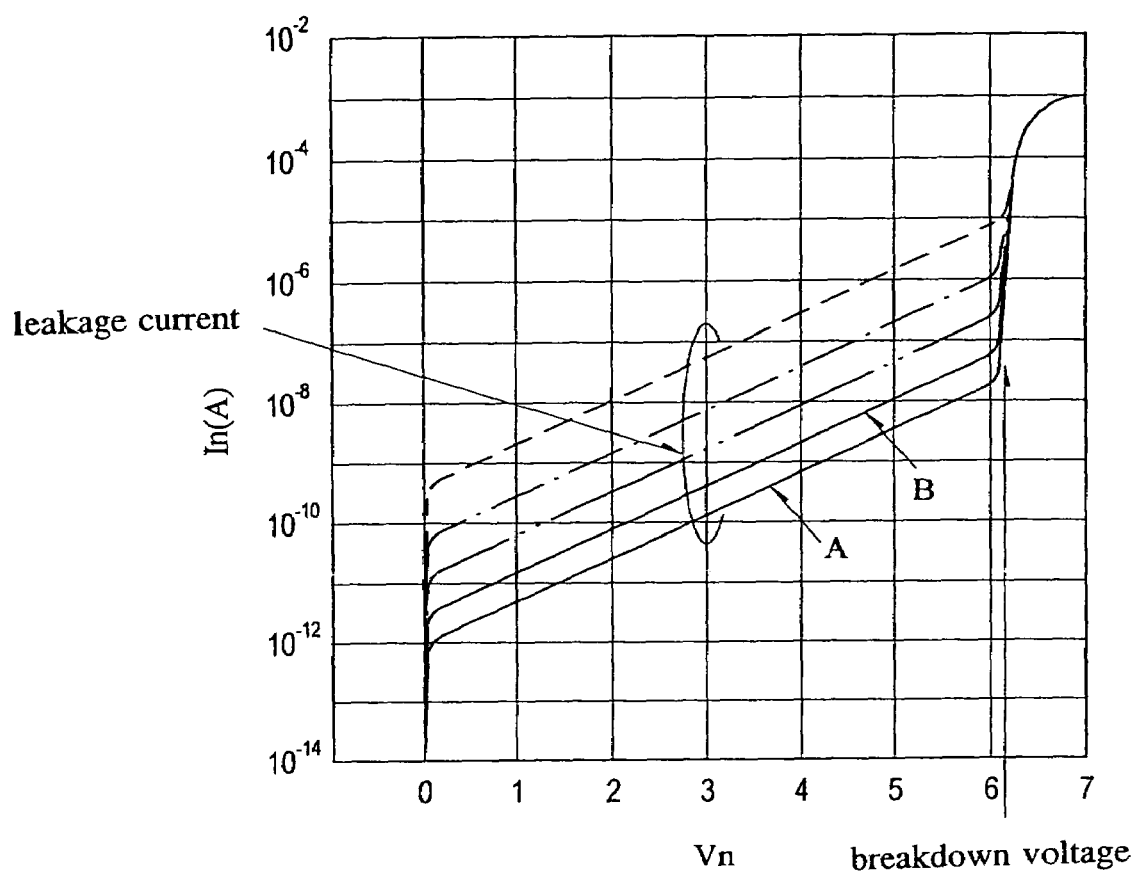
FIG. 6 is a graph showing the result obtained by measuring a relationship between a layout of a connection hole formed at an upper part of a zener diode and a leakage current generated at a voltage equal to or less than a breakdown voltage with respect to the zener diode of one step (i.e., single-stage).
Figure 7:
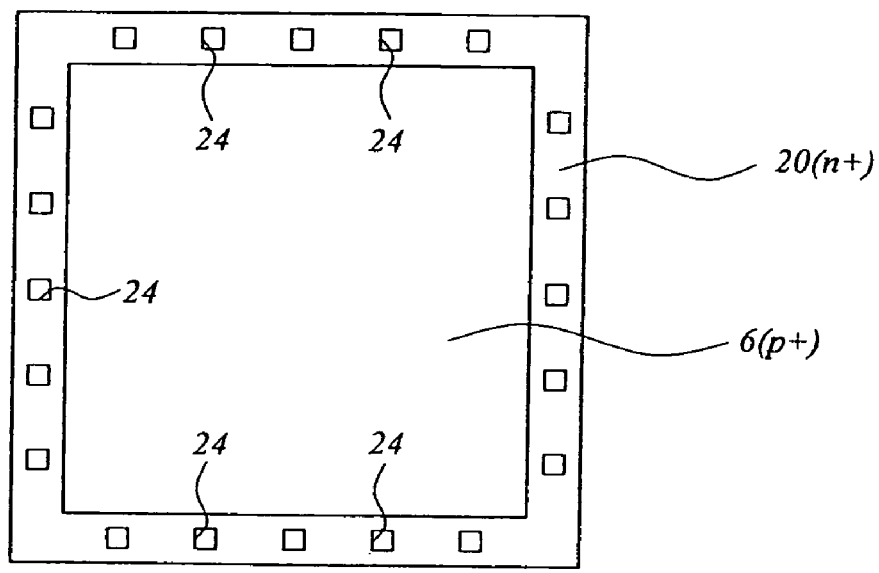
FIG. 7 is a plane view schematically showing a layout of connection holes formed at an upper part of a zener diode.

FIG. 6 is a graph showing results obtained by measuring a relationship between a layout of the above connection holes 24 and a leakage current generated at a voltage that is equal to or less than a fall (breakdown) voltage about a zener diode of one step. A solid line A shown in FIG. 6 shows the layout of the connection holes 24 in the embodiment as described previously, that is, a case in which, as schematically shown in FIG. 7, a plurality of connection holes 24 are arranged at the periphery of the $n^+$ type semiconductor region 20 (a region in which the $n^+$ type semiconductor region 20 and the $p^+$ type semiconductor region 6 do not form a junction) and in which the connection holes 24 are spaced from each other. In FIG. 7, the diameter of the respective connection holes 24 is defined as 0.45 microns, and a pitch between the adjacent connection holes 24 is defined as 3.8 microns.

Figure 8:
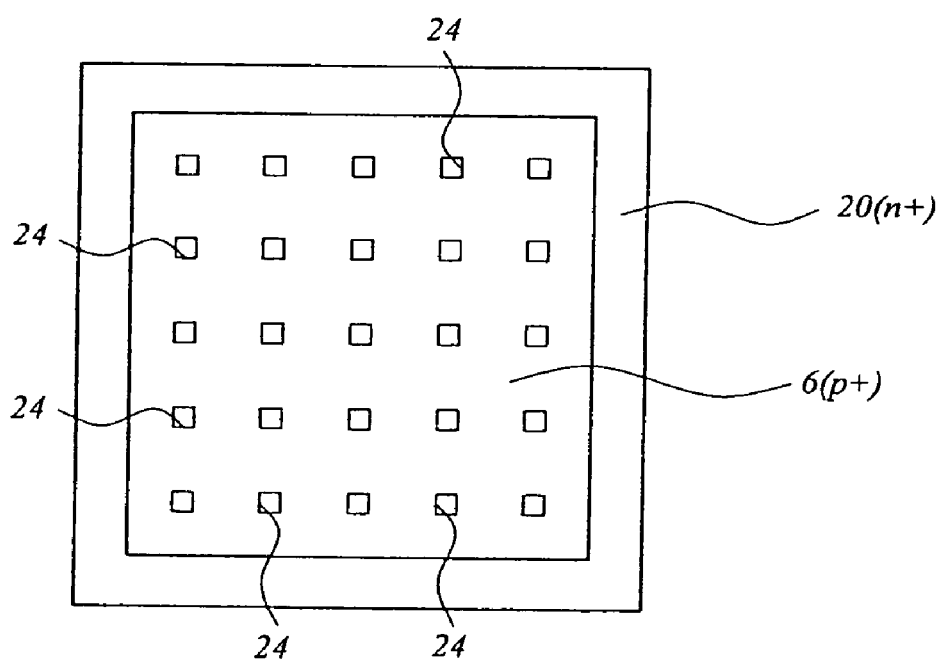
FIG. 8 is a plane view schematically showing another layout of connection holes formed at an upper part of a zener diode.
Figure 9:
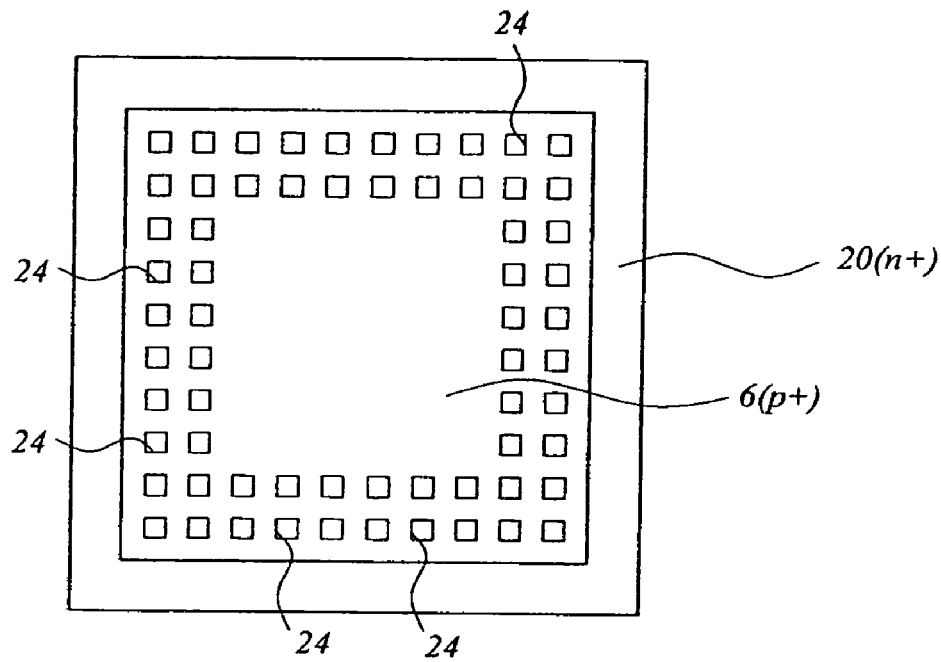
FIG. 9 is a plane view schematically showing a further layout of connection holes formed at an upper part of a zener diode.
Figure 10:
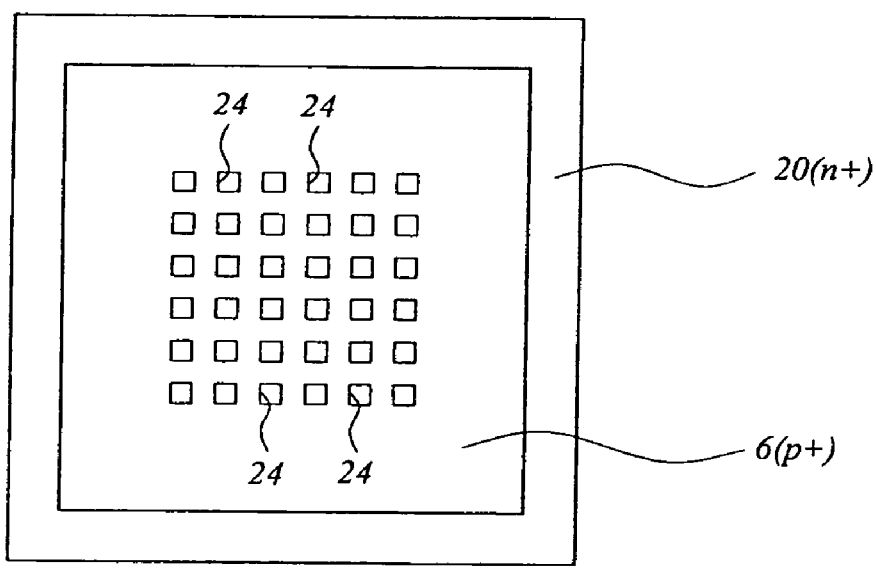
FIG. 10 is a plane view schematically showing a still further layout of connection holes formed at an upper part of a zener diode.
Figure 11:
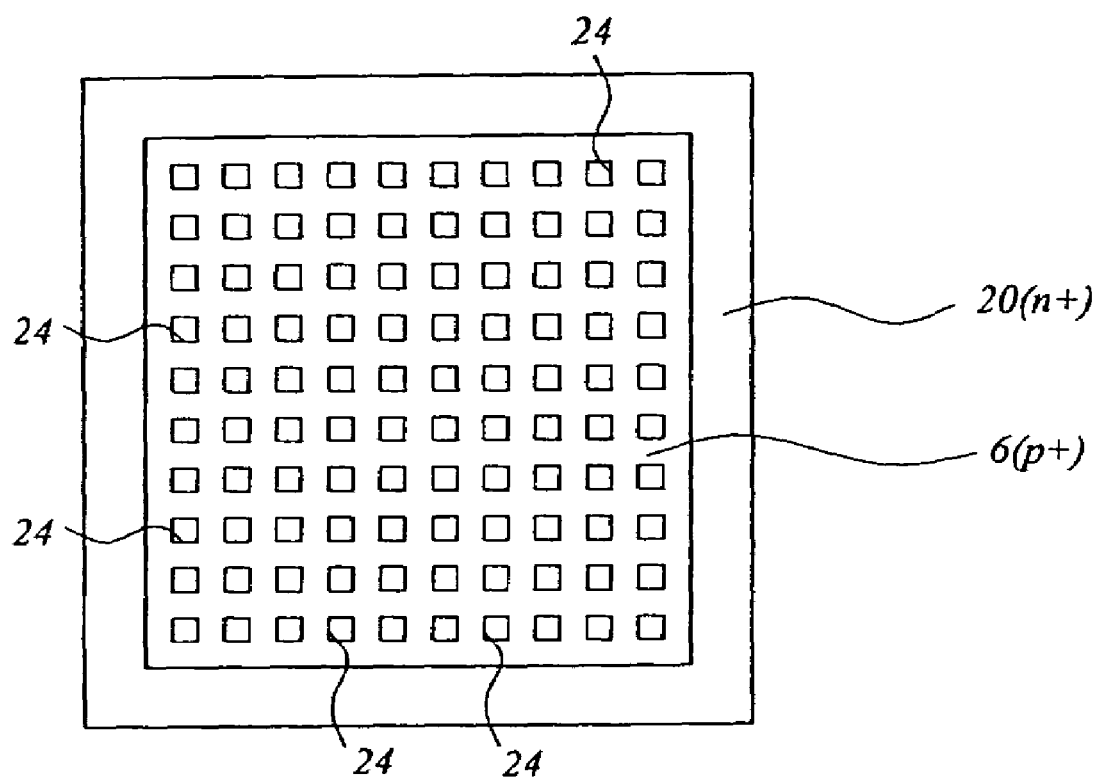
FIG. 11 is a plane view schematically showing another layout of connection holes formed at an upper part of a zener diode.

On the other hand, all of the solid line B, broken line, single dot and dash line, and double dot and dash line in FIG. 6 show a case in which the respective connection holes 24 are each 0.45 micron in diameter and are arranged at the upper part of the $p^+$ type semiconductor region 6, respectively. A solid line B of FIG. 6 shows a case in which a plurality of connection holes 24 are spaced from each other over a substantially full region of the $p^+$ type semiconductor region 6, as shown in FIG. 8. The double dot and dash line of FIG. 6 shows a case in which the connection holes 24 are densely arranged at the periphery of the $p^+$ type semiconductor region 6, as shown in FIG. 9. The single dot and dash line of FIG. 6 shows a case in which the connection holes 24 are densely arranged at the center of the $p^+$ type semiconductor region 6, as shown in FIG. 10. And, the broken line of FIG. 6 shows a case in which the connection holes 24 are densely arranged over a substantially full region of the $p^+$ type semiconductor region 6, as shown in FIG. 11. In an example shown in FIG. 8, a pitch between the connection holes 24 is defined as 3.8 microns. In all examples shown in FIG. 9 to FIG. 11, the pitch is defined as 0.95 microns.

As illustrated, in the layout (solid line A) according to the present embodiment, in which the connection holes 24 are spaced from each other at the periphery of the $n^+$ type semiconductor region 20, an amount of leakage current is the smallest. In addition, even in the case where the connection holes 24 are arranged at the upper part of the $p^+$ type semiconductor region 6, a case (the solid line B) in which the connection holes 24 are spaced from each other has a smaller leakage current in comparison with a case (the double dot and dash line, single dot and dash line, and broken line) in which the connections holes 24 are densely arranged.

In this manner, in the zener diodes ($D_1$, $D_2$) according to the present embodiment, the connection holes 24 for connecting the wires 21 and 22 and the $n^+$ type semiconductor region 20 to each other are not arranged at the center of the $n^+$ type semiconductor region 20, that is, in a region in which the $n^+$ type semiconductor region 20 and the $p^+$ type semiconductor region 6 form a junction, but are arranged at the periphery at which the junction depth thereof is deeper than the center. In this manner, in comparison with a case in which the connection holes 24 are arranged at the upper part of the $p^+$ type semiconductor region 6, the junction depth of the $n^+$ type semiconductor region 20 at the bottom of the respective connection holes 24 becomes great, and the generation of a tunnel current in this region is restricted. Thus, a leakage current generated at a voltage that is equal to or less than a fall (breakdown) voltage can be reduced.

In addition, the zener diodes ($D_1$, $D_2$) according to the present embodiment are arranged such that each of a plurality of connection holes 24 for connecting the $n^+$ type semiconductor region 20 and wires 21 and 22 to each other is spaced relative to a pitch between the adjacent connection holes 24, the pitch being greater than a minimum pitch between the connection holes of the circuit. In this manner, when the silicon oxide film 29 is etched in a manufacturing process, described later, to form the connection holes 24, an amount of shaving of the substrate 1 at the bottom of the respective connection holes 24 cannot be reduced. Thus, the drawback that would otherwise result from reducing the junction depth of the $n^+$ type semiconductor region 20 (i.e., making it more shallow) may be avoided. The pitch between the adjacent connection holes 24 is at least twice as long as the minimum pitch between the connection hole of the circuit, preferably three times longer and, more preferably, four times longer.

Next, an example of a method of manufacturing an EEPROM having the above zener diodes ($D_1$, $D_2$) in a periphery circuit will be described with reference to FIG. 12 to FIG. 20. In these figures, there is shown a region for a MONOS (Metal Oxide Nitride Oxide semiconductor) type MISFET that constitutes a memory cell of the EEPROM, an n channel type MISFET (LV NMOS) that constitutes a periphery circuit, a p channel type MISFET (LV PMOS), a high withstand voltage n channel type MISFET (HV NMOS), a high withstand voltage p channel type MISFET (HV PMOS), a high withstand voltage p channel type MISFET (depletion type) (HV PDMOS), and a zener diode.

Figure 12:
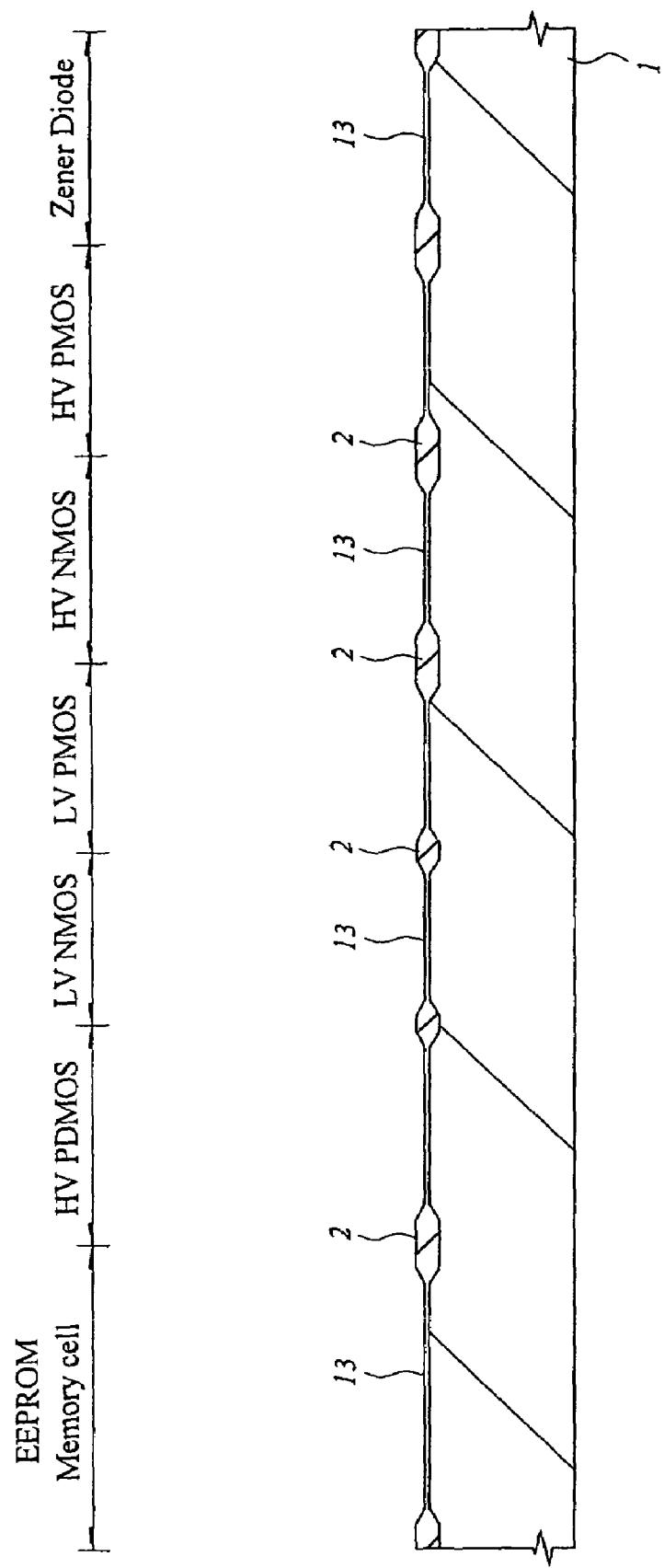
FIG. 12 is a cross section of essential parts of a semiconductor substrate for showing a processing of a method of manufacturing a system LEI according to one embodiment of the present invention.

First, as shown in FIG. 12, a semiconductor substrate 1 (hereinafter, referred to as a substrate) that consists of a p type mono-crystalline silicon is provided, for example, and a field insulation film 2 is formed on a primary face of the substrate by using a known LOCOS (LOCal Oxidation of Silicon) element isolation technology. At this time, a silicon oxide film 13 is formed on a surface of the substrate 1 in an active region surrounded by the field insulation film 2.

Figure 13:
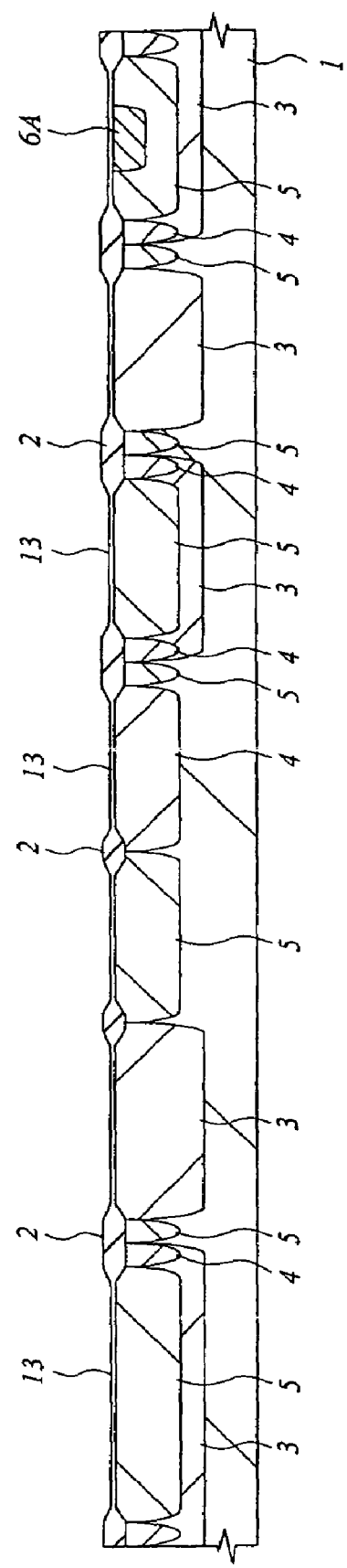
FIG. 13 is a cross section of essential parts of a semiconductor substrate for showing a further processing of a method of manufacturing a system LEI according to one embodiment of the present invention.

Next, as shown in FIG. 13, after phosphorus (P) ions are implanted into a part of the substrate 1 through the silicon oxide film 13, an n type scattering layer 3 is formed by annealing the substrate 1, where a dose quantity of phosphorus ion is $4.5 \times 1012$ $cm^{-2}$, and implantation energy thereof is 360 keV.

Then, phosphorus (P) ions are implanted into a part of the substrate 1, and boron (B) ions are implanted into another part. Thereafter, an n type well 4 and a p type well 5 are formed by annealing the substrate 1. At this time, a dose quantity of phosphorus ion is $1.2 \times 13^{13}$ $cm^{-2}$ and implantation energy thereof is 360 KeV while a dose quantity of boron ion are $0.8 \times 10^{13}$ $cm^2$ and implantation energy thereof is 200 keV.

Subsequently, after boron (B) ions are implanted into a part of the p type well 5 in a region for forming a zener diode, a $p^+$ type semiconductor region 6A is formed by annealing the substrate 1. In the $p^+$ type semiconductor region 6A, the $n^+$ type semiconductor region 20 is formed at an upper part thereof in a subsequent process, thereby forming a $p^+$ type semiconductor region 6 that constitutes a part of a zener diode (D).

Figure 14:
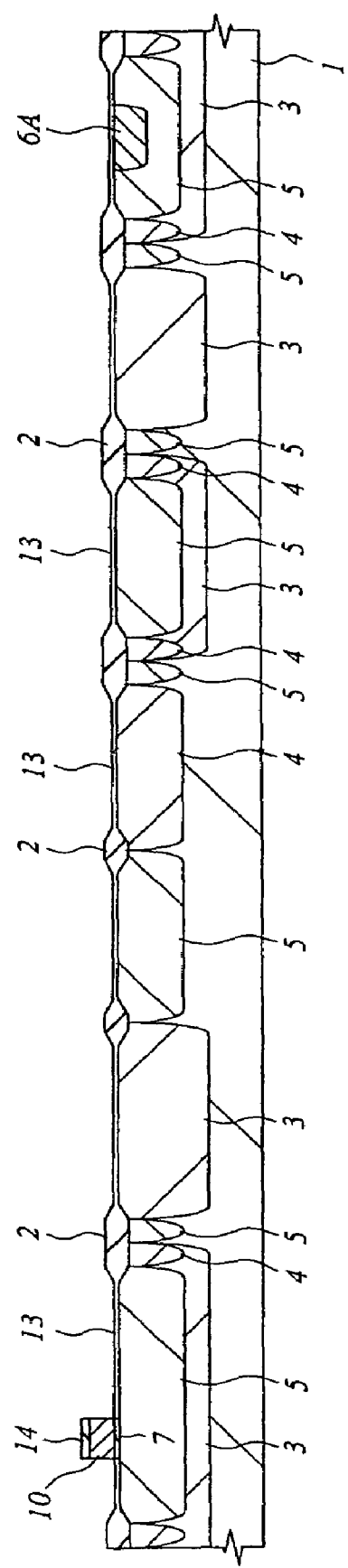
FIG. 14 is a cross section of essential parts of a semiconductor substrate for showing a still further processing of a method of manufacturing a system LEI according to one embodiment of the present invention.

Next, as shown in FIG. 14, a gate insulation layer 7 composed of three layer insulation films, each consisting of a silicon film, a silicon nitride film, and a silicon oxide film, is formed at a part of a memory cell forming region. Thereafter, a gate electrode 10 for rewriting data is formed at an upper part of this gate insulation film 7.

To form the gate insulation film 7 and the gate electrode 10, a part of the silicon oxide film 13 formed on the surface of the p type well 5 in the memory cell forming region is first removed by etching, and then, the substrate 1 is oxidized in oxygen atmosphere diluted by nitrogen, whereby a silicon oxide film (not shown) of about 1.8 nm in film thickness is formed on the surface of the p type well 5 in a region in which the above-mentioned silicon oxide film 13 is removed. Next, a silicon nitride film (not shown) of about 18 nm in film thickness is deposited on the substrate 1 by using a CVD method. Thereafter, by annealing the substrate 1, a silicon oxide film (not shown) of about 3 nm in film thickness is formed on the surface of the above-mentioned silicon nitride film.

Next, n type poly-crystalline silicon film (not shown) of about 200 nm in film thickness formed by doping phosphorus (P) is deposited on the substrate 1 by using the CVD method, and then, a silicon oxide film 14 of about 100 nm in film thickness is deposited at an upper part of this poly-crystalline silicon film by using the CVD method. Thereafter, a photo-resist film is masked, and respective parts of the silicon oxide film 14, the poly-crystalline silicon film and gate insulation film 7 are etched, and thereby the gate electrode 10 and the gate insulation film 7 are formed, respectively. To this gate electrode 10, a rewriting high voltage (Vpp) or power supply voltage (Vcc) is supplied through the constant voltage generation circuit shown in FIG. 2 at the time of data rewriting (writing and erasing). And, electrons or positive holes are implanted into the gate insulation film 7 at a lower part of the gate electrode due to a tunnel effect.

Figure 15:
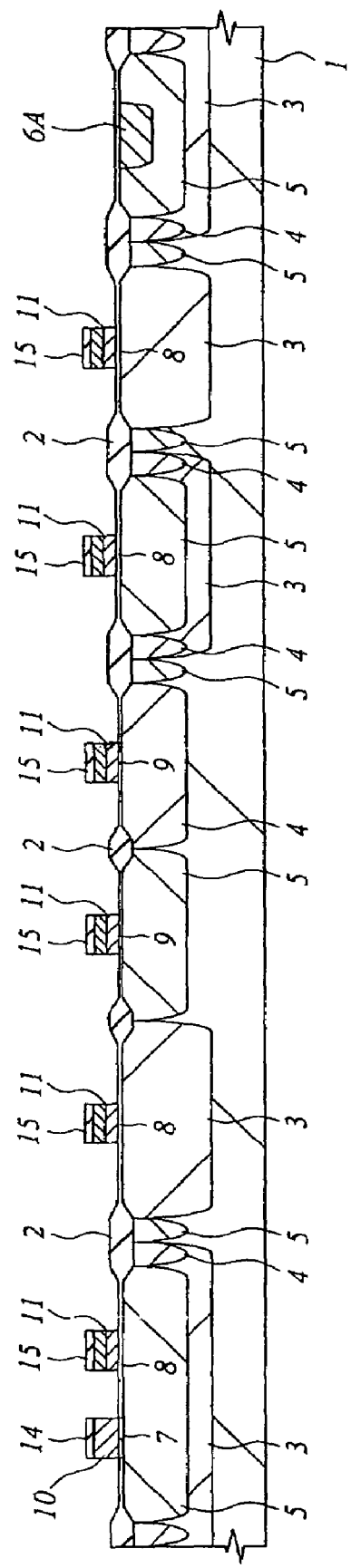
FIG. 15 is a cross section of essential parts of a semiconductor substrate for showing a further processing of a method of manufacturing a system LEI according to one embodiment of the present invention.

Next, as shown in FIG. 15, a thick gate insulation film 8 of about 23 nm in film thickness is formed in the surface of the n type scattering layer 3 and the p type well 5 in a memory cell forming region and a high withstand voltage MISFET forming region. Then, a thin gate insulation film 9 or 8 nm in film thickness is formed on the surface of the n type well 4 and the p type well 5 in another region. Thereafter, a gate electrode 11 is formed at each upper part of the gate insulation films 8 and 9.

To form the gate insulation films 8 and 9, a silicon oxide film 13 formed on each surface of the n type scattering layer 3, n type well 4, and p type well 5 is removed by etching, and then the substrate 1 is oxidized. Thereby, the thick gate insulation film 8 is formed on the each surface of the n type scattering layer 3, n type well 4, and p type well 5. Next, the gate insulation film 8 is left on the each surface of the n type scattering layer 3 and p type well 5 in the memory cell forming region and high withstand voltage MISFET forming region. And, the gate insulation film 8 in the other region is removed by etching. Thereafter, the thin gate insulation film 9 is formed on each surface of the n type well 4 and p type well 5 in the above-mentioned other region by oxidizing the substrate 1.

Next, an n type poly-crystalline silicon film (not shown) of about 80 nm in film thickness formed by doping phosphor (P) is deposited at the upper part of the gate insulation films 8 and 9 by using the CVD method, and then, a W (tungsten) silicide film (not shown) of about 100 nm in film thickness is deposited at the upper part of this poly-crystalline silicon film by using a sputtering method. Further, a silicon oxide film 15 of about 150 nm is deposited at its upper part by using the CVD method. Thereafter, a photo-resist film is masked and the silicon oxide film 15, the W silicide film, and the poly-crystalline silicon film are etched, and thereby the gate electrode 11 is formed.

Figure 16:
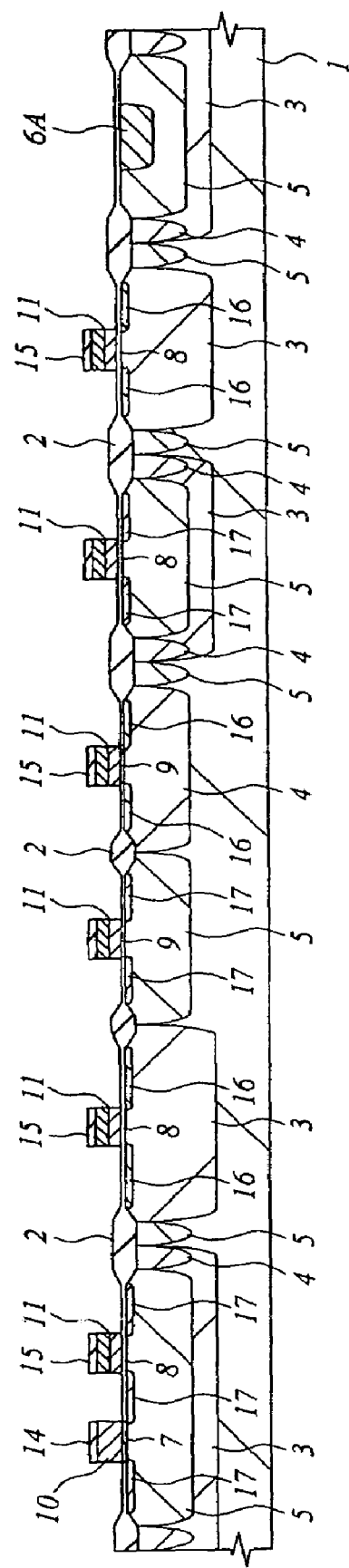
FIG. 16 is a cross section of essential parts of a semiconductor substrate for showing a further processing of a method of manufacturing a system LEI according to one embodiment of the present invention.

Next, as shown in FIG. 16, boron (B) ions are implanted into the n type scattering layer 3 and the n type well 4 to form a p− type semiconductor region 16 with low impurity concentration. Phosphorus (P) ions are implanted into the p type well 5 to form the n− type semiconductor region 17 with low impurity concentration.

Figure 17:
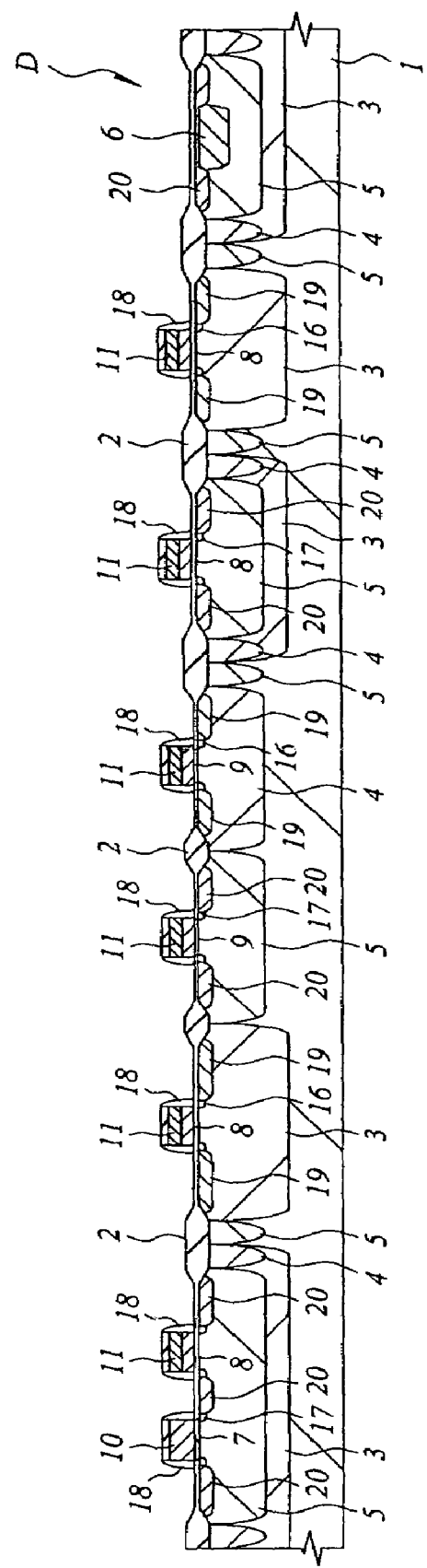
FIG. 17 is a cross section of essential parts of a semiconductor substrate for showing a still further processing of a method of manufacturing a system LEI according to one embodiment of the present invention.

Next, as shown in FIG. 17, each of side wall spacers 18 is formed on respective side walls of gate electrodes 10 and 11. Then, boron (B) ions are implanted into the n type scattering layer 3 and the n type well 4 and thereby a p$^+$ type semiconductor region (source and drain) 19 with high impurity concentration is, respectively, formed in a memory cell forming region and a peripheral circuit forming region. Although not shown in the figure, a p$^+$ type semiconductor region 19 is also formed at a part of the p type well 5 in the zener diode forming region (at the lower part of the connection hole 25 shown in FIG. 4) at this time. In addition, arsenic (As) ions and phosphorus (P) ions are implanted into the p type well 5, and thereby a n$^+$ type semiconductor region (source and drain) 20 with high impurity concentration is formed in a peripheral circuit forming region. And, the n$^+$ type semiconductor region 20 with high impurity concentration is formed in a zener diode forming region. The side wall spacers 18 are formed by performing isotropic etching of a silicon oxide film (not shown) deposited on the substrate 1 by using the CVD method. At this time, dose quantity of boron ion is defined as $2\times10^{15}$ cm$^{-2}$ and implantation energy thereof is defined as 10 keV. Dose quantity of arsenic ion is defined as $3\times10^{15}$ cm$^{-2}$ and implantation energy thereof is defined as 60 keV. And, dose quantity of phosphorus ion is defined as $5\times10^{13}$ cm$^{-2}$ and implantation energy thereof is defined as 60 keV.

With these processes, a MISFET that constitutes memory cells of EEPROM and a MISFET that constitutes a periphery circuit are completed, respectively. In addition, the n$^+$ type semiconductor region 20 with the high impurity concentration is formed in the p− type well 5 in a zener diode forming region in which the p$^+$ semiconductor region 6A is formed. Thereby, a zener diode (D) composed of the n$^+$ type semiconductor region 20 and the p$^+$ semiconductor region 6 formed at its lower part is completed.

Figure 18:
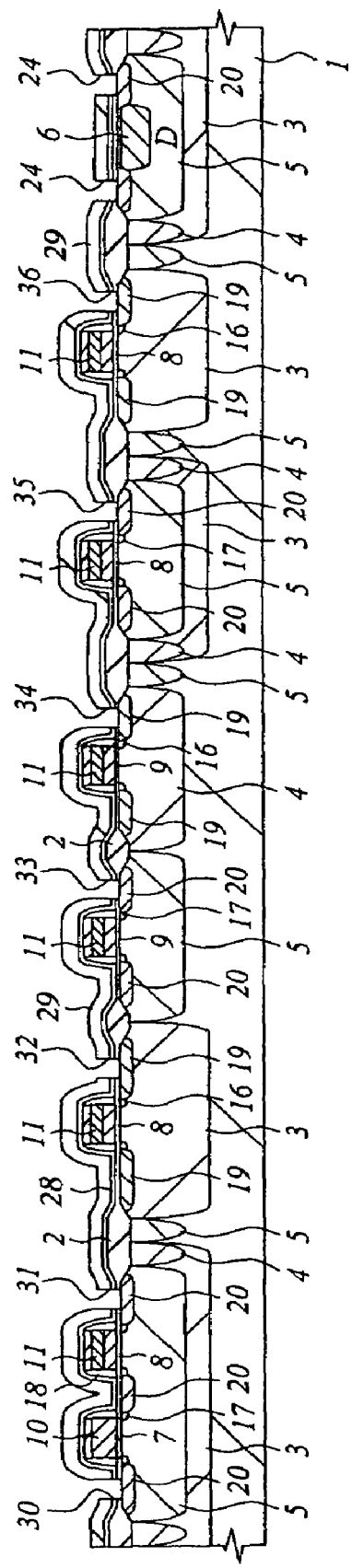
FIG. 18 is a cross section of essential parts of a semiconductor substrate for showing a further processing of a method of manufacturing a system LEI according to one embodiment of the present invention.

Next, as shown in FIG. 18, two silicon oxide layers 28 and 29 are deposited at the respective upper parts of the MISFET and zener diode (D) by using the CVD method. Then, a photo-resist film is masked and the silicon oxide films 28 and 29 are dry etched. Thereby, each of connection holes 30 to 36 is formed at the respective upper parts of the source and drain of the above-mentioned MISFET (p$^+$ type semiconductor region 19 and n$^+$ type semiconductor region 20), connection holes 24 are formed at the upper part of the n$^+$ type semiconductor region 20 of the zener diode (D), and then a connection hole 25 not shown in FIG. 18 is formed at a part of a p type well 5 in the zener diode forming region (at the upper part of the p$^+$ semiconductor region 19 shown in FIG. 4). As described previously, the respective connection holes 24 formed at the upper part of the n$^+$ type semiconductor region 20 for the zener diode (D) are arranged at the periphery of the n$^+$ type semiconductor region 20 (outside of the p$^+$ type semiconductor region 6), that is, in a region in which the junction depth of the n type semiconductor region 20 is deep, in order to reduce a leakage current.

In addition, the connection holes 24 are spaced from each other. According to examination of the inventor, in general, in the case where a plurality of connection holes are formed by dry etching using a photo-resist film as a mask, if the connection holes are densely arranged, an aspect ratio of the connection holes is lowered due to a decrease in film at a side wall and/or a top part of a resist pattern. Consequently, the amount of substrate shaving is increased at the bottom of the respective connection holes. Therefore, in the case of the above-mentioned zener diode (D), the junction depth of the n$^+$ type semiconductor region 20 is shallow at the bottom of the respective connection holes 24, which causes an increase of a leakage current. Accordingly, since a distance between the adjacent connection holes 24 is spaced from each other, the amount of shaving of the n$^+$ type semiconductor region 20 is reduced at the bottom of the respective connection holes 24, so that a leakage current can be further reduced. In the case where the connection holes are densely arranged, a decrease of a film of a resist pattern occurs irrespective of positive type and/or negative type. Further, such decrease is induced by various factors such as interference of exposure light and the like.

Figure 19:
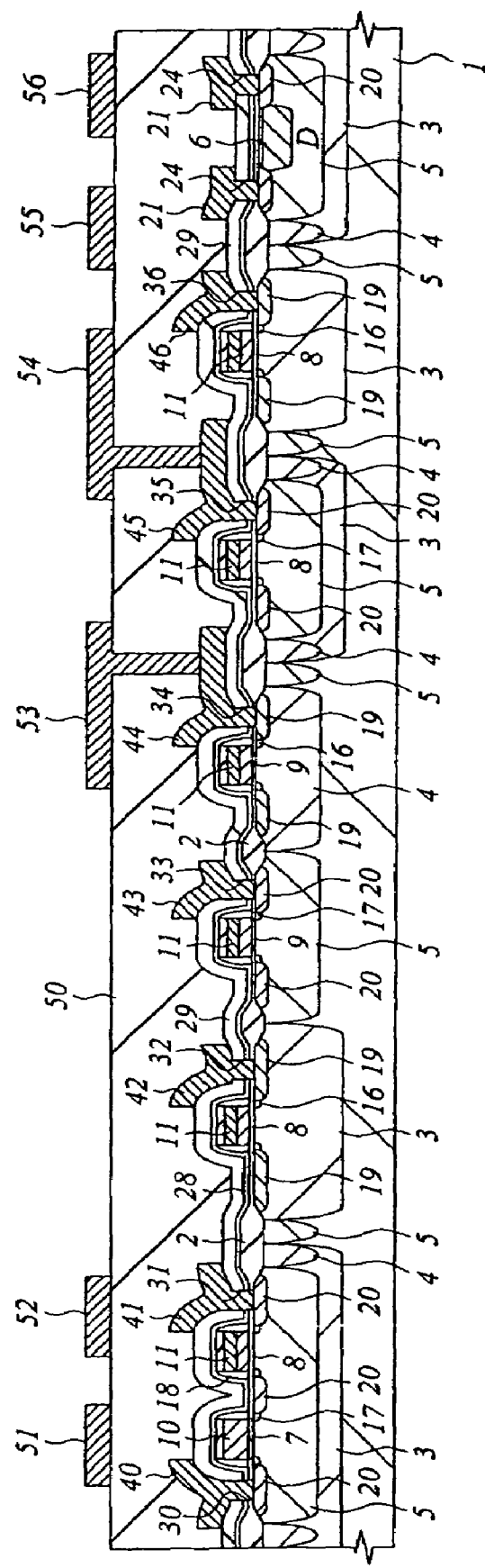
FIG. 19 is a sectional view of essential parts of a semiconductor substrate for showing a further processing of a method of manufacturing the system LEI according to one embodiment of the present invention.

Next, as shown in FIG. 19, wires 21 (and wires 22 and 23 not shown in FIG. 19) and wires 40 to 46 which are in a first layer are provided at the upper part of a silicon oxide layer 29 and, then, a silicon oxide film 50 is deposited at respective upper parts of the wires 21 (and the wires 22 and 23 not shown in FIG. 19) and the wires 40 to 46 by using the CVD method. Thereafter, wires 51 to 56 which are in a second layer are provided at an upper part of the silicon oxide film 50. The wires 21 and 40 to 46 in the first layer and the wires 51 to 56 in the second layer are formed by performing the dry etching of a metal film such as a W (tungsten) film deposited by the CVD method, an Al alloy film deposited by a sputtering method or the like. After a plug (electrically conductive connection body) consisting of a W film is embedded inside of the connection holes 30 to 36 and 24, the wires 21 and 40 to 46 in the first wire may be formed.

Figure 20:
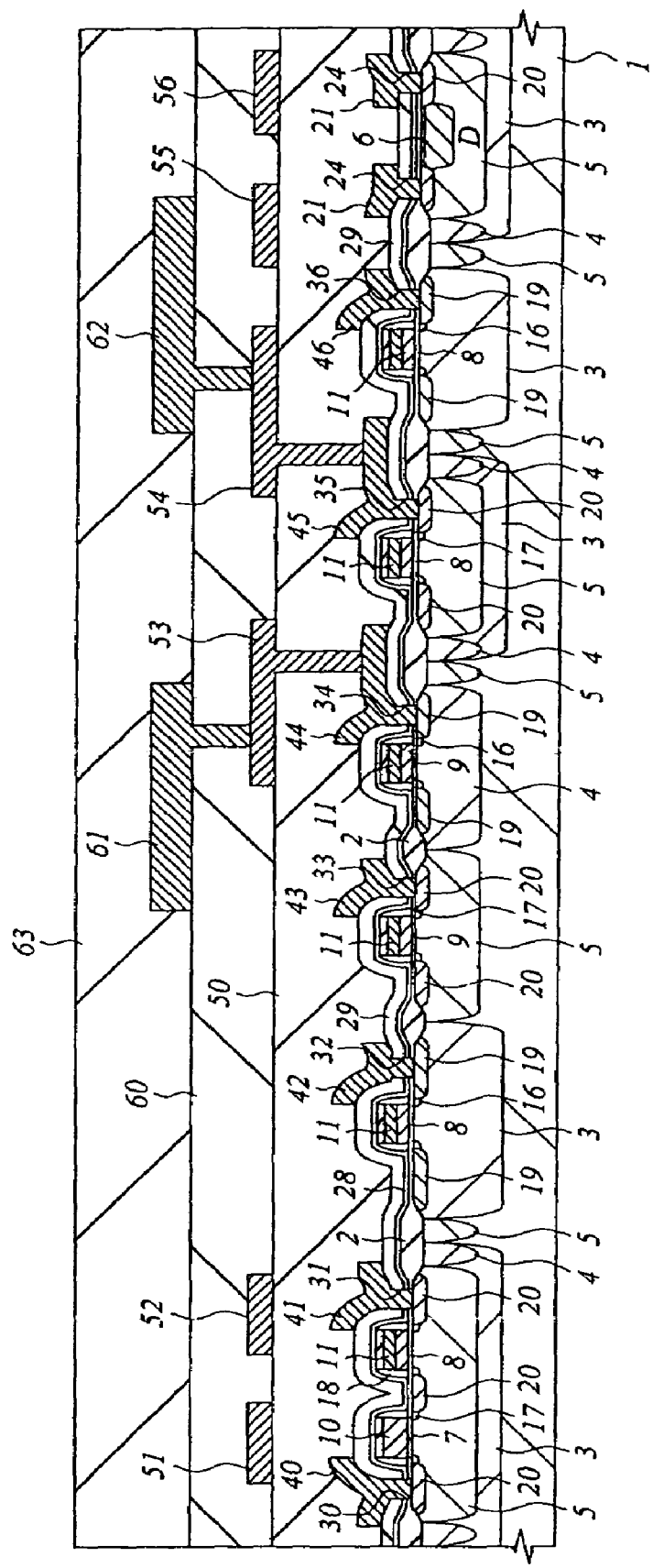
FIG. 20 is a cross section of essential parts of a semiconductor substrate for showing a still further processing of a method of manufacturing a system LEI according to one embodiment of the present invention.

Thereafter, as shown in FIG. 20, a silicon oxide film 60 is deposited at respective upper parts of the wires 51 to 56 in the second layer by using the CVD method, and then, wires 61 and 62 which are in a third layer are formed at an upper part of the silicon oxide film 60 in the same method as the above-mentioned one. Thereafter, by forming a surface protection film 63 deposited at respective upper parts of the wires 61 and 62 in a third layer by using the CVD method, an EEPROM is substantially completed. The surface protection film 63 consists of a laminate film having a silicon oxide film and a silicon nitride film and the like.

As has been described above, according to the present embodiment, a leakage current created in a zener diode can be reduced, so that the leakage current at a fall (breakdown) start voltage can be reduced to 1 μA or less, for example, and a rewrite voltage (Vpp) generated at the constant voltage generating circuit can be constantly supplied to an EEPROM.

Figure 21A:
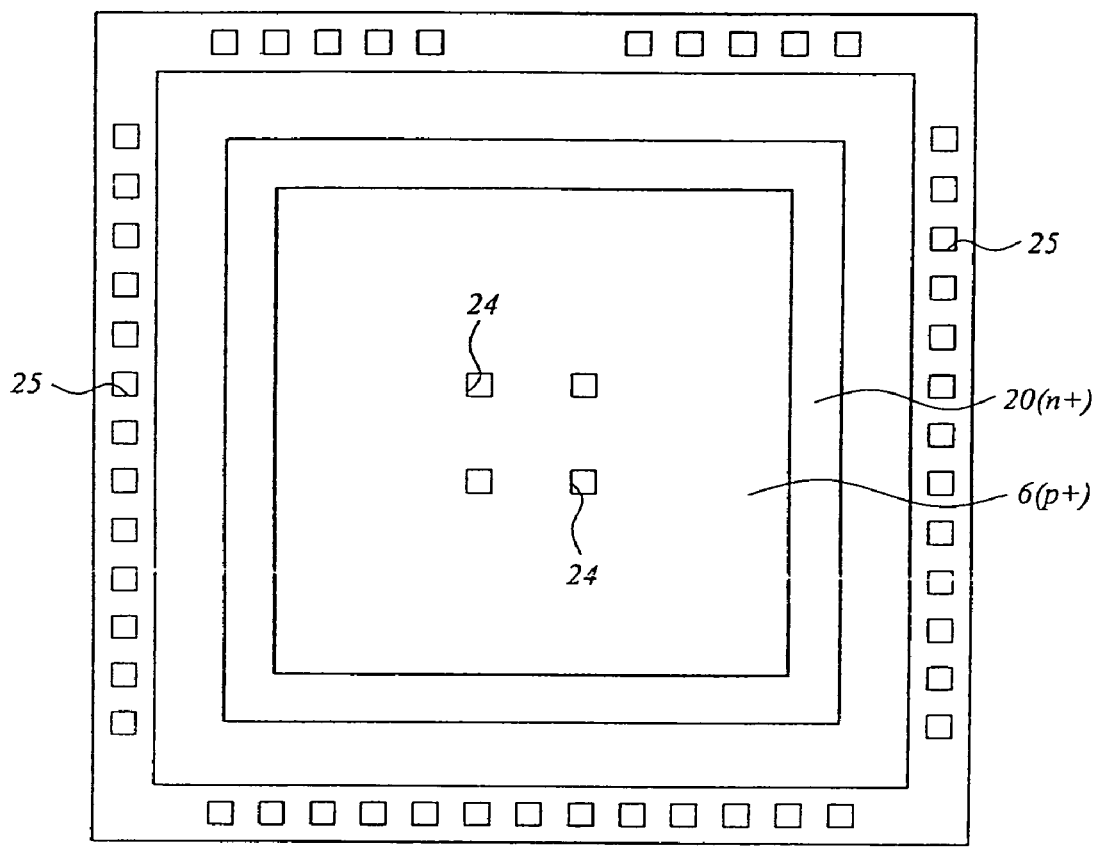
FIG. 21(a) is a plane view schematically showing a layout of connection holes formed at an upper part of a zener diode.
Figure 21B:
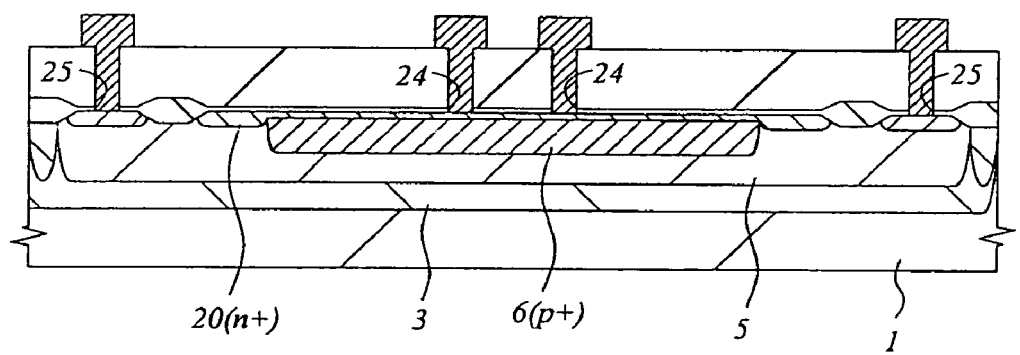
FIG. 21(b) is a cross section of FIG. 21(a) schematically showing a layout of connection holes formed at an upper part of a zener diode.
Figure 22A:
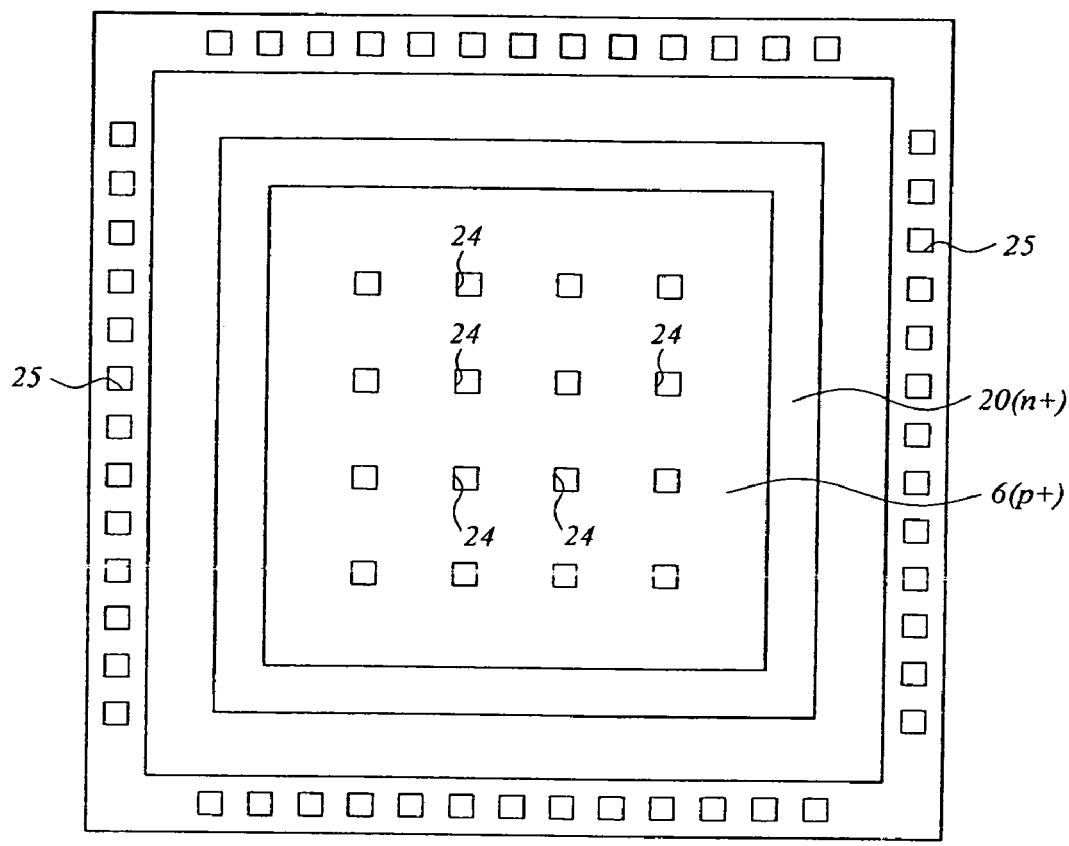
FIG. 22(a) is a plane view schematically showing another layout of connection holes formed at an upper part of a zener diode.
Figure 22B:
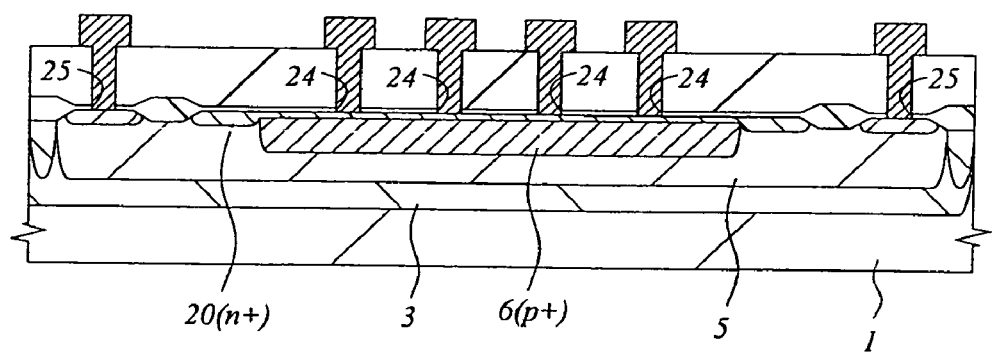
FIG. 22(b) is a cross section of FIG. 22(a) schematically showing a further layout of a connection hole formed at an upper part of a zener diode.

In the present embodiment, a plurality of connection holes 24 for connecting the n+ type semiconductor region 20 of the zener diode (D) and wires to each other are arranged only at the periphery of the n+ type semiconductor region 20. However, in the case where an area of a region surrounding the periphery of the n+ type semiconductor region 20 becomes small by, for example, adopting micro-fabrication, the connection holes 24 may be arranged at the upper part of the p+ type semiconductor region 6, as shown in FIG. 21 and FIG. 22. In this case too, as indicated by the solid line B of the graph shown in FIG. 6, sufficient distance between adjacent ones of the connection holes 24 is maintained, and thereby an increase of a leakage current can be reduced to the minimum thereof. In addition, occasionally, the connection holes 24 can be spaced from each other in both of the n+ type semiconductor region 20 and p+ type semiconductor region 6.

Figure 23A:
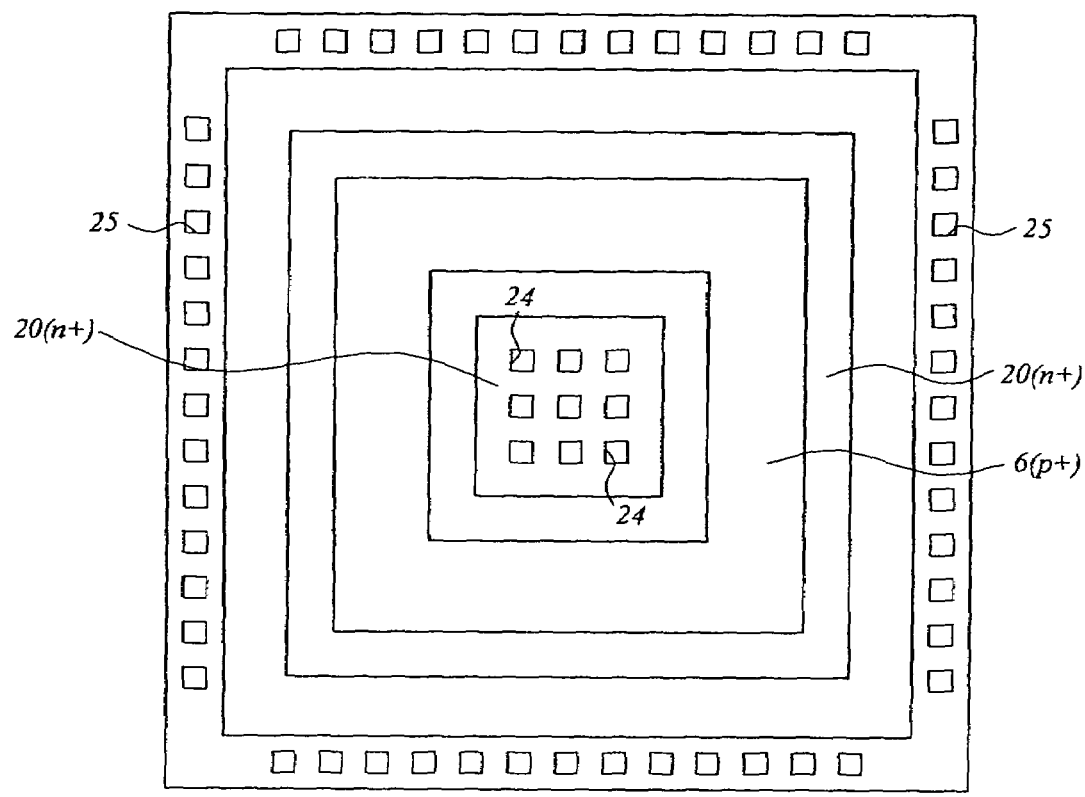
FIG. 23(a) is a plane view schematically illustrating a still further layout of connection holes formed at an upper part of a zener diode.
Figure 23B:
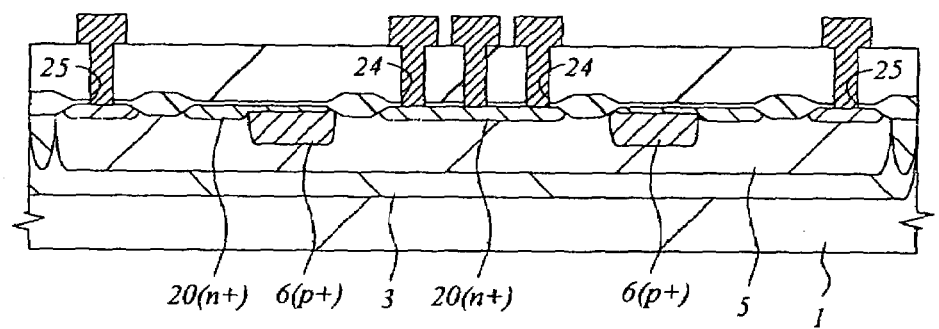
FIG. 23(b) is a cross section of FIG. 23(a) schematically illustrating an additional layout of connection holes formed at an upper part of a zener diode.

In the present embodiment, although the p+ type semiconductor region 6 of the zener diode (D) is arranged on the center of the n+ type semiconductor region 20, the p+ type semiconductor region may be arranged in a region other than the center, as shown in FIG. 23, for example. In this case too, a plurality of connection holes 24 for connecting the n+ type semiconductor region 20 and wires to each other are arranged in a region in which the n+ type semiconductor region 20 and the p+ type semiconductor region 6 do not form a junction.

In addition, some of a plurality of connection holes 24 may be arranged at the upper part of the p+ type semiconductor region 6. In this case, however, a sufficient distance between adjacent ones of the connection holes 24 is maintained and thereby an increase of a leakage current can be reduced to the maximum thereof.

Further, the p+ type semiconductor region 19 shown in FIG. 4 has a comparatively small effect on element characteristics due to the substrate shaving. Thus, a pitch between the connection holes 25 formed in the upper part of this region may be minimal pitch of the circuit.

Second Embodiment

A system LSI according to the present embodiment is constituted to include a bipolar transistor in a part of a peripheral circuit of an EEPROM.

Figure 24:
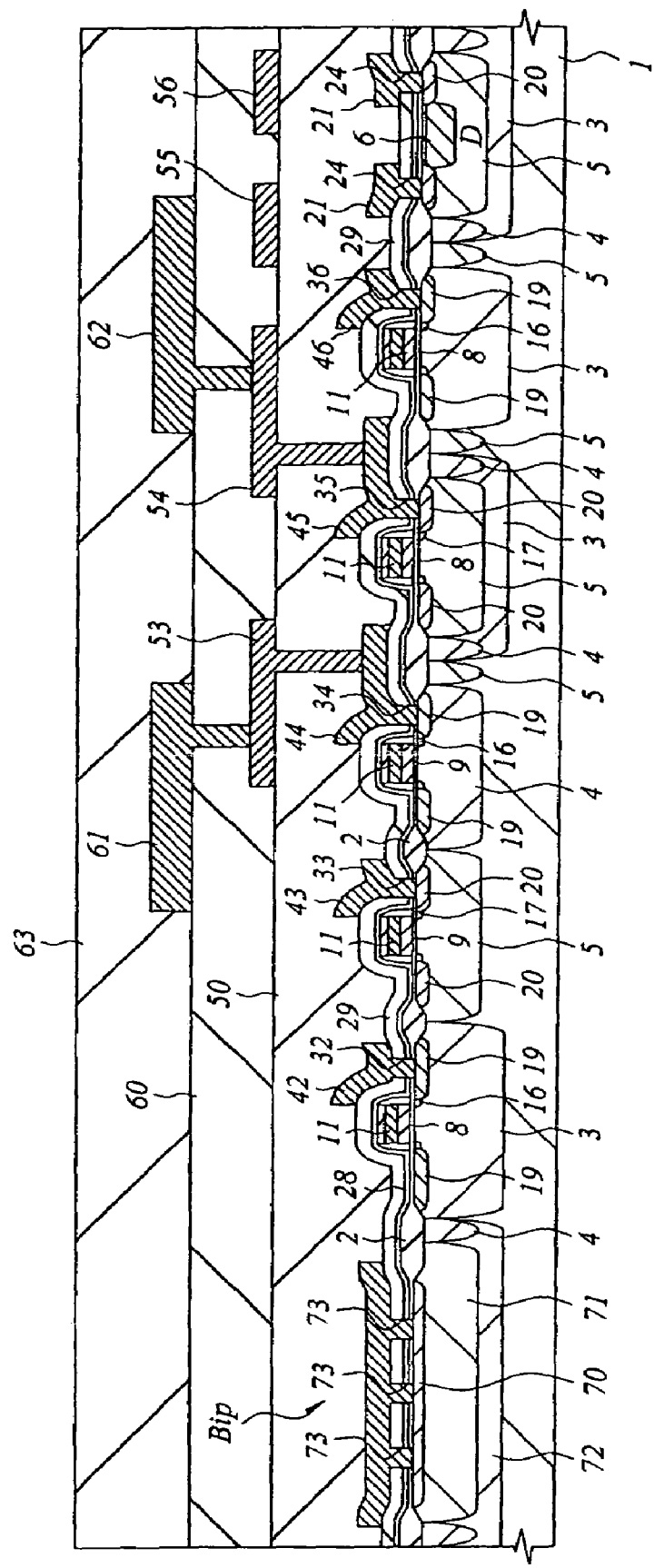
FIG. 24 is a cross section of essential parts of a semiconductor substrate for showing a system LSI according to another embodiment of the present invention.

FIG. 24 is a cross section of essential portions of a substrate 1 on which a bipolar transistor (Bip) is formed, and FIG. 25 is a plane view showing a layout of connection holes 73 and 74 for connecting an emitter region 70, base region 71, and collector region 72 of this bipolar transistor (Bip) and wires (not shown) to each other.

For example, in the case of an npn type bipolar transistor, a main component of a base current is a positive hole current that flows from the base region 71 to the emitter region 70. However, when each of the connection holes 73 is formed at an upper part of the emitter region 70 by means of dry etching, if substrate shaving occurs at the respective bottoms of the connection holes 73, the emitter region 70 is substantially shallow. Therefore, positive holes that are a minority carrier implanted into the emitter region 70 from the base region 71 easily reaches an emitter electrode, and a base current increases. As a result, a direct current amplification rate (hFE) is lowered. That is, the substrate shaving of the emitter region 70 has a great effect on element characteristics in comparison with that of the base region 71 or collector region 72.

In this embodiment, a pitch between the adjacent connection holes 73 at the upper part of the emitter region 70 is greater than a pitch between the adjacent connection holes 74 and a pitch between the adjacent connection holes 75 at the upper part of the base region 71 or collector region 72 that has a comparatively small effect on the element characteristics. So, the substrate shaving quantity is reduced when the connection holes 73 are formed at the upper part of the emitter region 70.

FIG. 26 is a graph showing a relationship between a direct current amplification rate hFE (collector current $I_C$/base current $I_B$) and a pitch between the adjacent connection holes at the upper part of the emitter region. As illustrated, a case in which the connection holes (a total of 18 holes) are arranged with a minimum pitch in nine rows and two columns is compared with a case in which the nine connection holes are arranged in a zigzag manner to extend the pitch. As a result, the direct current amplification rate hFE obtained by the case where the pitch between the adjacent connection holes is extended is improved from 76 to 159 by minimum pitch.

As described above, although invention made by the inventors has been specifically described based on the embodiments, the present invention is not limited to the foregoing embodiments. And, it goes without saying that various modifications can occur without departing from the scope of the invention.

For example, in the foregoing embodiment, a description has been given to a case in which the present invention is applied to a zener diode composed of an n+ type semiconductor region formed in a p type well and a p+ type semiconductor region formed in the p type well at the lower part of (i.e., beneath) this n+ type semiconductor region. However, the present invention is also applicable to another zener diode in which the conductivity type is reversed from the above-mentioned type, that is, another zener diode is composed of a P+ type semiconductor region formed in n type well and an n+ type semiconductor region formed in the n type well at the lower part of (i.e., beneath) this p+ type semiconductor region.

Following Advantages

An effect obtained by the typical invention disclosed in the present application will be briefly described here.

According to the present invention, a leakage current at a fall (breakdown) start voltage of a zener diode can be eminently reduced. Thus, for example, the zener diode constituted according to the present invention is applied to a constant voltage generating circuit of an EEPROM, so that a rewrite voltage created in the constant voltage generating circuit is stabilizedly supplied to the EEPROM.

In addition, according to the present invention, the substrate shaving caused at the time of forming a connection hole for connecting a substrate and a wire to each other can be restricted. In this manner, for example, in forming a connection hole for connecting a semiconductor region for the zener diode and a wire to each other, the drawback that the junction depth of the semiconductor region becomes shallow at the bottom of the connection hole can be prevented. Therefore, the leakage current created in the zener diode can be further reduced.

What is claimed is:

1. A method of manufacturing a semiconductor integrated circuit device comprising:

(a) forming a semiconductor region of a first conductivity type in a first region at a primary face of a semiconductor substrate of said first conductivity type, and then forming, on said semiconductor substrate above said semiconductor region of the first conductivity type, a semiconductor region of a second conductivity type having a greater area of a planar pattern than said semiconductor region of the first conductivity type such that there is formed a zener diode comprised of said semiconductor region of the first a conductivity type and said semiconductor region of the second conductivity type, wherein said semiconductor region of the second conductivity type, constituting a part of said zener diode, is formed simultaneously to the forming of another semiconductor region of the second conductivity type for producing a source and a drain of a MISFET formed in a second region at the primary face of said semiconductor substrate;

(b) forming an insulation film on the primary face of said semiconductor substrate, and then forming a plurality of connection holes in said insulation film which are extended to an upper part of a region located outside a junction formed between the semiconductor regions of said first and second conductivity types; and (c) forming a wire at the upper part of said insulation film, wherein said wire and said semiconductor region of said second conductivity type effect an electrical connection through said plurality of connection holes.

2. A method of manufacturing a semiconductor integrated circuit device according to claim 1, wherein each of said plurality of connection holes is spaced from each other so that a pitch between the adjacent connection holes is greater than a minimum pitch between connection holes of a circuit of the device.

3. A method of manufacturing a semiconductor integrated circuit device according to claim 1, wherein the semiconductor regions of the first and second conductivity types form a PN junction that extends into said first region shallower than that of said semiconductor region of the second conductivity type in a region in which said PN junction is not formed.

4. A method of manufacturing a semiconductor integrated circuit device according to claim 3, wherein said first region is a well region of said first conductivity type.

5. A method of manufacturing a semiconductor integrated circuit device according to claim 1, wherein said semiconductor region of the first conductivity type centrally underlies said semiconductor region of the second conductivity.

6. A method of manufacturing a semiconductor integrated circuit device according to claim 1, wherein said first region is a well region of said first conductivity type.

7. A method of manufacturing a semiconductor integrated circuit device comprising:

(a) forming an element isolation portion in a semiconductor substrate of a first conductivity type, and forming a MISFET forming region and a diode forming region that are separated by said element isolation portion;

(b) forming a first semiconductor region of said first conductivity type in said diode forming region, said first semiconductor region having an impurity concentration higher than that of said semiconductor substrate;

(c) forming a gate electrode of a MISFET on said MISFET forming region; and (d) forming a second semiconductor region of a second conductivity type, opposite to said first conductivity type, in said MISFET forming region and in said diode forming region, wherein said second semiconductor region of said diode forming region is formed above said first semiconductor region and has a larger area, defined by a planar pattern thereof, than said first semiconductor region.

8. A method of manufacturing a semiconductor integrated circuit device according to claim 7, further comprising:

(e) forming an insulating film over said MISFET forming region and said diode forming region, and (f) forming a first connection hole and a second connection hole in said insulating film, said first connection hole being extended to said second semiconductor region of said MISFET forming region, and second connection hole being extended to said second semiconductor region of said diode forming region.

9. A method of manufacturing a semiconductor integrated circuit device according to claim 8, wherein said second connection hole is arranged in a region located outside a junction formed between said first and second semiconductor regions of said diode forming region.

10. A method of manufacturing a semiconductor integrated circuit device according to claim 7, further comprising:

(g) forming a first well region in said MISFET forming region and a second well region in diode forming region.

11. A method of manufacturing a semiconductor integrated circuit device according to claim 7, wherein said first conductivity type is an n-type conductivity, and said second conductivity is an p-type conductivity.

12. A method of manufacturing a semiconductor integrated circuit device according to claim 7, wherein said first conductivity type is a p-type conductivity, and said second conductivity is an n-type conductivity.

13. A method of manufacturing a semiconductor integrated circuit device comprising:

(a) forming a zener diode in a first region of a semiconductor substrate, and (b) forming a MISFET in a second region of said semiconductor substrate, wherein the forming of said zener diode comprises (a1) forming a first semiconductor region of a first conductivity type in said first region, and (a2) forming a second semiconductor region of a second conductivity type, opposite to said first conductivity type, in said first region, and wherein the forming of said MISFET comprises (b1) forming source/drain regions of said second conductivity type in said second region wherein the forming of said second semiconductor region in said first region and said source/drain regions in said second region are effected in a same step in the manufacture of the device.

14. A method of manufacturing a semiconductor integrated circuit device according to claim 13, wherein said first semiconductor region of said diode forming region has a smaller area, defined by a planar pattern thereof, than said second semiconductor region corresponding thereto.

15. A method of manufacturing a semiconductor integrated circuit device according to claim 13, wherein said first conductivity type is an n-type conductivity, and said second conductivity is a p-type conductivity.

16. A method of manufacturing a semiconductor integrated circuit device according to claim 13,
wherein said first conductivity type is a p-type conductivity, and said second conductivity is an n-type conductivity.

17. A method of manufacturing a semiconductor integrated circuit device according to claim 14, wherein the first and second semiconductor regions of said zener diode form a PN junction that extends into said first region shallower than that of said second semiconductor region in which said PN junction is not formed.

18. A method of manufacturing a semiconductor integrated circuit device according to claim 17, wherein said first and second regions are individual well regions.

19. A method of manufacturing a semiconductor integrated circuit device according to claim 13, wherein said first and second regions are individual well regions.

20. A method of manufacturing a semiconductor integrated circuit device comprising:
 (a) forming an element isolation portion in a semiconductor substrate, and forming a MISFET forming region and a diode forming region that are separated by said element isolation portion;
 (b) forming first wells in said MISFET forming region and said diode forming region, said first wells having a first conductivity type;
 (c) forming a first semiconductor region of said first conductivity type in said diode forming region, said first semiconductor region having an impurity concentration higher than that of said first wells;
 (d) forming a gate electrode of a MISFET on said MISFET forming region; and
 (e) forming second semiconductor regions of a second conductivity type, opposite to said first conductivity type, in said first wells, wherein, in said diode forming region, the planar size of said second semiconductor region is larger than that of said first semiconductor region, and the depth of said first semiconductor region is deeper than that of said second semiconductor region.

21. A method of manufacturing a semiconductor integrated circuit device according to claim 20, further comprising:
 (f) forming an insulating film over said MISFET forming region and diode forming region, and
 (g) forming a first connection hole and a second connection hole in said insulating film, said first connection hole being extended to said second semiconductor region of said MISFET forming region, and second connection hole being extended to said second semiconductor region of said diode forming region.

22. A method of manufacturing a semiconductor integrated circuit device according to claim 21,
wherein said second connection hole is arranged in a region located outside a junction formed between said first and second semiconductor regions of said diode forming region.

23. A method of manufacturing a semiconductor integrated circuit device according to claim 20,
wherein said first conductivity type is an n-type conductivity, and said second conductivity type is a p-type conductivity.

24. A method of manufacturing a semiconductor integrated circuit device according to claim 20,
wherein said first conductivity type is a p-type conductivity, and said second conductivity type is an n-type conductivity.

* * * * *